United States Patent
Tanaka et al.

(10) Patent No.: US 8,466,540 B2
(45) Date of Patent: Jun. 18, 2013

(54) SEMICONDUCTOR DEVICE AND MANUFACTURING METHOD THEREFOR

(75) Inventors: Shigeki Tanaka, Hokkaido (JP);
Masakazu Sakano, Hokkaido (JP);
Toshiyuki Shinya, Hokkaido (JP);
Takafumi Konno, Hokkaido (JP);
Kazuaki Yoshida, Hokkaido (JP);
Takashi Sato, Hokkaido (JP); Atsushi Fujisawa, Hokkaido (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 436 days.

(21) Appl. No.: 12/693,984

(22) Filed: Jan. 26, 2010

(65) Prior Publication Data
US 2010/0193923 A1    Aug. 5, 2010

(30) Foreign Application Priority Data
Jan. 30, 2009    (JP) .................................. 2009-019568

(51) Int. Cl.
*H01L 23/495*    (2006.01)

(52) U.S. Cl.
USPC .................................. 257/676; 257/E23.031

(58) Field of Classification Search
USPC ................. 257/676, 737–738, 777, 784, 787, 257/686, E23.031, 666
See application file for complete search history.

(56) References Cited

U.S. PATENT DOCUMENTS

| 2007/0210392 A1 | 9/2007 | Sakakibara et al. |
| 2008/0195817 A1* | 8/2008 | Hiew et al. ..................... 711/115 |
| 2009/0096041 A1* | 4/2009 | Sakakibara et al. ........... 257/419 |

FOREIGN PATENT DOCUMENTS

| JP | 62-042551 | 2/1987 |
| JP | 2001-24139 | 1/2001 |
| JP | 2008-089327 A | 4/2008 |

OTHER PUBLICATIONS

Official Action dated Oct. 23, 2012 issued in Japanese counterpart application (No. 2009-019568).

* cited by examiner

*Primary Examiner* — Hoa B Trinh
(74) *Attorney, Agent, or Firm* — Womble Carlyle

(57) ABSTRACT

The reliability of a semiconductor device is prevented from being reduced. A planar shape of a sealing body is comprised of a quadrangle having a pair of first sides, and a pair of second sides crossing with the first sides. Further, it has a die pad, a controller chip (first semiconductor chip) and a sensor chip (second semiconductor chip) mounted over the die pad, and a plurality of leads arranged along the first sides of the sealing body. The controller chip and the leads are electrically coupled to each other via wires (first wires), and the sensor chip and the controller chip are electrically coupled to each other via wires (second wires). Herein, the die pad is supported by a plurality of suspending leads formed integrally with the die pad and extending from the die pad toward the first sides of the sealing body. Each of the suspending leads has an offset part.

12 Claims, 20 Drawing Sheets

SEMICONDUCTOR DEVICE AND MANUFACTURING METHOD THEREFOR

CROSS-REFERENCE TO RELATED APPLICATIONS

The disclosure of Japanese Patent Application No. 2009-19568 filed on Jan. 30, 2009 including the specification, drawings and abstract is incorporated herein by reference in its entirety.

BACKGROUND OF THE INVENTION

The present invention relates to a semiconductor device and a manufacturing technology thereof. More particularly, it relates to a technology effectively applicable to a semiconductor device in which a plurality of semiconductor chips are arranged in an array in one package.

Some semiconductor devices come in the form of semiconductor devices using a lead frame called SOP (Small Outline Package).

The SOP includes, for example, as shown in FIG. 2 of Japanese Unexamined Patent Publication No. 2001-24139 (Patent Document 1), a tab (die pad) for mounting a pellet thereon, a plurality of leads respectively arranged on both adjacent sides of the tab (the left-to-right direction of FIG. 2), and tab suspending leads formed integrally with the tab, and led out in the direction in which the leads are not arranged (the top-to-bottom direction of FIG. 2).

[Patent Document 1]
Japanese Unexamined Patent Publication No. 2001-24139

SUMMARY OF THE INVENTION

The present inventors conducted a study on manufacturing, using a lead frame, of a semiconductor device including a sensor type semiconductor chip (which will be hereinafter referred to as a sensor chip) for detecting dynamic amounts such as acceleration and angular velocity, and a controller type semiconductor chip (which will be hereinafter referred to as a controller chip) for controlling the sensor chip, and performing signal input/output with external equipment, merged therein.

First, when a plurality of semiconductor chips are merged in one semiconductor device, there can be considered the following methods: the semiconductor chips are mounted in an array over a die pad; or on one semiconductor chip, another semiconductor chip are stacked.

The sensor chip is a semiconductor chip for detecting the dynamic amounts such as acceleration and angular velocity, and outputting them as electric signals. The thickness thereof is generally larger than that of the controller chip. Therefore, from the viewpoint of reducing the thickness of the whole semiconductor device, it is preferable that the controller chip and the sensor chip are arranged in an array. Thus, this time, the present inventors conducted a study on the method for mounting a plurality of semiconductor chips (a sensor chips and a controller chip) in an array over a die pad, and found the following problem.

When the sensor chip and the controller chip are arranged in an array over the die pad, conceivably, the chips are mounted such that the space therebetween is located in the vicinity of the central part of the semiconductor device (or the die pad).

However, the sensor chip does not perform direct input/output of signals with external equipment. In contrast, the controller type chip has an interface for the sensor chip (internal interface), and an interface for external equipment (external interface).

For this reason, when there is a lead arranged apart from the controller chip, the length of the wire to be bonded to the lead becomes large. This results in irregularity in inductance of the wires for electrically coupling the pad of the controller chip to be directly coupled to the external equipment and a plurality of leads which are external coupling terminals. Further, when the length of the wire increases, the shape of the wire for coupling the controller chip and the leads is lost. This may cause a short circuit between the adjacent wires or between the sensor chip and the wires. Particularly, a thickness of the sensor chip is larger than that of the controller chip. Therefore, when the wire loop of the wire arranged at a position closest to the sensor chip passes above the sensor chip, there is an increasing fear of a short circuit with the sensor chip. From the foregoing viewpoint, a plurality of the leads to be electrically coupled with the controller chip are preferably arranged close (in a gathered manner) to the side of the controller chip.

On the other hand, from the viewpoint of the mounting reliability improvement upon mounting a semiconductor device over a mounting substrate, even when a plurality of leads are arranged close to the controller chip, groups of a plurality of the leads are preferably arranged at the central part of the semiconductor device. This is due to the following: when a plurality of the leads also having a function as a support member for mounting a semiconductor device are arranged on one side, the balance is lost, and the stability is deteriorated.

Therefore, from the two viewpoints, even when the sensor chip and the controller chip are mounted in an array, the controller chip is preferably arranged generally at a center of the semiconductor device.

However, as described above, the thickness of the sensor chip is larger than that of the controller chip. When a plurality of semiconductor chips thus having different thicknesses are arranged in an array, the direction of flow of a resin to be charged tends to become unstable in a resin sealing step. This causes a reduction of the reliability of the semiconductor device.

For example, in the resin sealing step, a sealing resin is injected with the lead frame including a plurality of semiconductor chips mounted thereon being put in the cavity formed by a mold forming die. However, when the pressure in the die during injection varies, there may occur a defect that the sealing rein is not completely charged in a part of the cavity.

The present invention has been made in view of the foregoing problem. It is an object of the present invention to provide a technology capable of suppressing the reduction of the reliability of a semiconductor device.

It is another object of the present invention to reduce the manufacturing cost of a semiconductor device.

The foregoing and other objects and novel features of the present invention will be apparent from the description of this specification and the accompanying drawings.

Summaries of the representative ones of the inventions disclosed in the present application will be described in brief as follows.

Namely, a semiconductor device in one embodiment of the present invention, includes: a sealing body having a planar shape comprised of a quadrangle including a pair of first sides, and a pair of second sides crossing with the first sides; a die pad; a plurality of suspending leads formed integrally with the die pad and extending from the die pad toward the first sides of the sealing body; a plurality of leads arranged around the die pad, and arranged along the first sides of the sealing body; a first semiconductor chip having a first main surface, a plurality of first electrode pads formed on the first main surface, and a first back surface opposed to the first main surface, and mounted over the die pad; a second semiconductor chip having a second main surface, a plurality of second electrode pads formed on the second main surface, and a second back surface opposed to the second main surface, and mounted over the die pad; a plurality of first wires for electrically coupling the leads and the first electrode pads of the first semiconductor chip, respectively; and a plurality of second wires for electrically coupling the first electrode pads of the first semiconductor chip and the second electrode pads of the second semiconductor chip, wherein the die pad, the suspending leads, the leads, the first semiconductor chip, the second semiconductor chip, the first wires, and the second wires are covered with the sealing body, and each of the suspending leads has an offset part.

Effects obtainable by the representative ones of the inventions disclosed in the present application will be described in brief as follows.

Namely, it is possible to suppress the reduction of the reliability of the semiconductor device.

DESCRIPTION OF THE PREFERRED EMBODIMENTS

Explanation of Description Form, Basic Terms, and Methods in the Present Application In the present application, in the following description of embodiments, the description may be divided into a plurality of sections for convenience, if required. However, unless otherwise specified, these sections are not independent of each other, but, irrespective of the context of description, are respective parts of a single example, in a relation such that one is a detailed explanation of a part of the other, a modification example of a part or the whole, or the like of the other. Further, in principle, the repetitive description of the same parts will be omitted. Whereas, respective constituent elements in embodiments are not essential, unless otherwise specified, or except for the case where the number is theoretically limiting, and unless otherwise apparent from the context.

Similarly, in the description of embodiments, and the like, the term "X including A" or the like for the material, composition, or the like does not exclude the one including an element other than A as a main constituent element unless otherwise specified and unless otherwise apparent from the context. For example, for the component, the term is used to embrace "X including A as a main component", and the like. For example, it is naturally understood that the term "silicon member" or the like herein used is not limited to pure silicon but also embraces a SiGe (silicon germanium) alloy, other multinary alloys containing silicon as a main component, and other members containing additives, and the like. Whereas, it is understood that the terms "gold plating", "Cu layer", "nickel plating", and the like embrace not only pure ones, but also members respectively containing gold, Cu, nickel, and the like as main components, unless otherwise specified.

Further, also when a reference is made to a specific numerical value or quantity, the numerical value may be a numerical value greater than the specific numerical value or a numerical value less than the specific numerical value, unless otherwise specified, except for the case where the number is theoretically limited to the numerical value, and unless otherwise apparent from the context.

(Embodiment)

<Structure of Sensor Chip>

Figure 1:
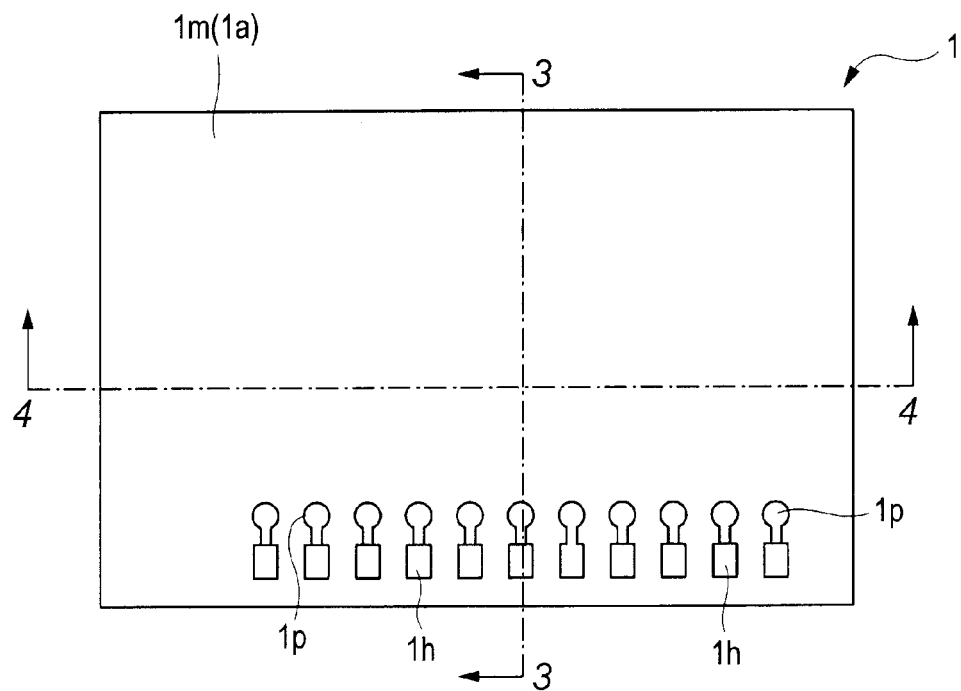
FIG. 1 is a plan view showing the upper surface side of a sensor chip included in a semiconductor device which is one embodiment of the present invention.
Figure 2:
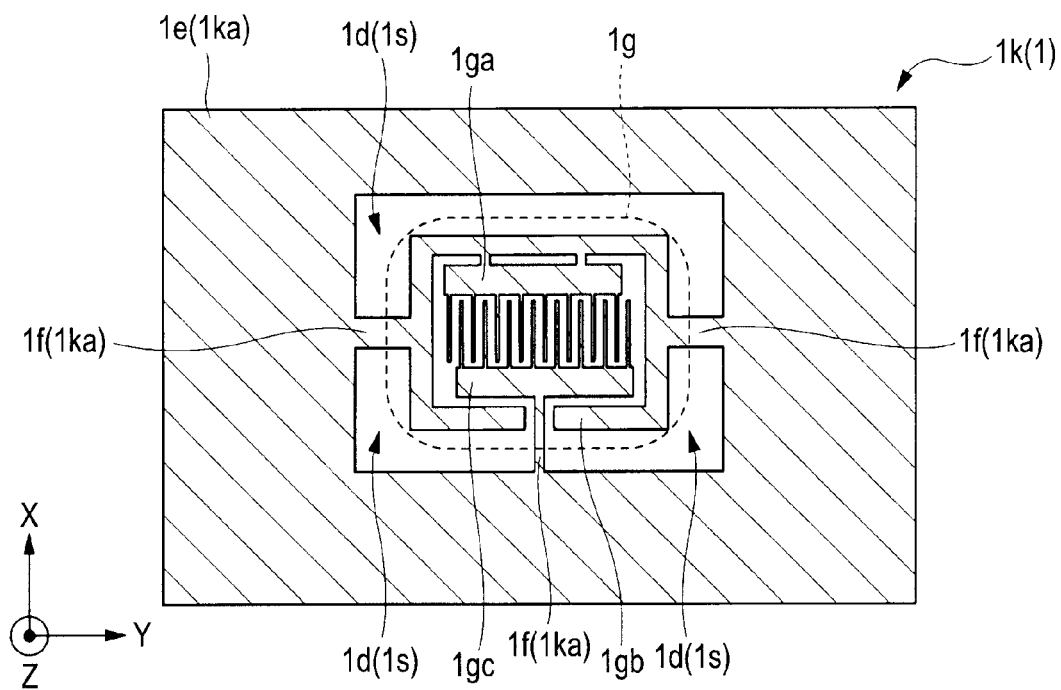
FIG. 2 is a plan view showing the upper surface side of a main body part of the sensor chip shown in FIG. 1.
Figure 3:
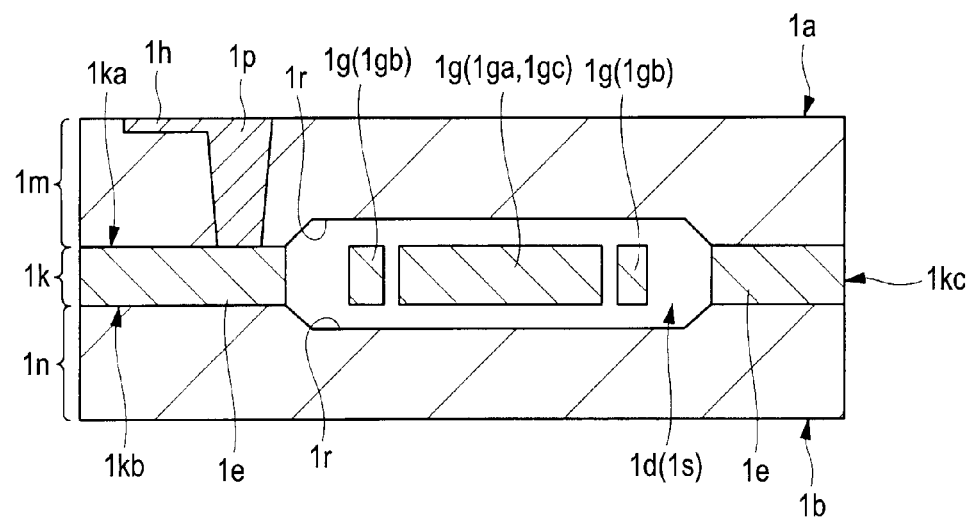
FIG. 3 is a cross sectional view along line A-A shown in FIG. 1.
Figure 4:
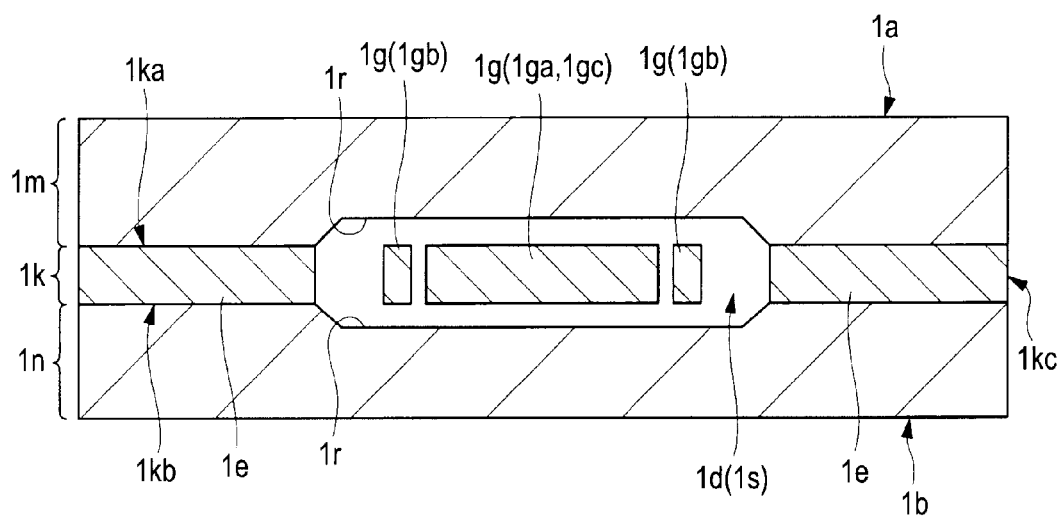
FIG. 4 is a cross sectional view along line B-B shown in FIG. 1.

First, by reference to FIGS. 1 to 4, a description will be given to the structure of the sensor chip included in a semiconductor device of this embodiment. FIG. 1 is a plan view showing the upper surface side of a sensor chip included in a semiconductor device which is one embodiment of the present invention. FIG. 2 is a plan view showing the upper surface side of a main body part of the sensor chip shown in FIG. 1, and FIG. 3 is a cross sectional view along line A-A shown in FIG. 1. FIG. 4 is a cross sectional view along line B-B shown in FIG. 1.

The sensor chip of this embodiment is a sensor chip formed by using a semiconductor microprocessing technique called MEMS. The sensor chip has a mechanism of detecting the dynamic amount such as acceleration or angular velocity, and outputting it as an electric signal to the outside. In this embodiment, a description will be given by taking an oscillator type angular velocity sensor as an example of the sensor chip for detecting the dynamic amount.

A sensor chip (second semiconductor chip) 1 of this embodiment has a main body part 1k, and lid parts (a first lid member 1m and a second lid member 1n) bonded to the main surface 1ka and the back surface 1kb of the main body part 1k, respectively, and arranged in such a manner as to interpose the main body part 1k therebetween. In other words, the sensor chip 1 is an assembly of the main body part 1k, and the first lid member 1m and the second lid member 1n.

The main body part 1k forming the sensor chip 1 includes, for example, Si (silicon). Whereas, the first and second lid members 1m and 1n include a glass material such as borosilicate glass. Incidentally, even in the case where a glass material is used as the first and second lid members 1m and 1n of the sensor chip 1, the glass material such as borosilicate glass contains $SiO_2$ as a main component, and hence has generally the same characteristics as those of the Si material in terms of the characteristics such as the linear expansion coefficient, or the adhesion with a resin described later. Therefore, when the linear expansion coefficient of the sensor chip 1, the adhesion with a resin, or the like is considered, the sensor chip 1 can be regarded as including Si.

The first lid member 1m bonded on the main surface 1ka side of the main body part 1k has a main surface (second main surface) 1a of the sensor chip 1 opposed to the bonding surface with the main body part 1k. In the main surface 1a, a plurality of pads (second electrode pads) 1h which are external electrodes of the sensor chip 1 are formed. The pads 1h are electrically coupled with the main body part 1k via vias 1p which are a plurality of conductive paths penetrating through in the direction of thickness of the first lid member 1m. On the other hand, the second lid member 1n to be bonded on the back surface 1kb side of the main body part 1k has a back surface (second back surface) 1b of the sensor chip 1 opposed to the bonding surface with the main body part 1k. In other words, the sensor chip 1 has the main surface 1a including a plurality of the pads 1h formed therein, and the back surface 1b located opposed to the main surface 1a.

Further, the first and second lid members 1m and 1n respectively have cavities (pit parts) 1r on the side of the surfaces (inner sides) opposing the main body part 1k. The cavities 1r respectively formed in the first and second lid members 1m and 1n are formed at the opposing positions, and form a hollow part (void) 1s. In other words, the sensor chip 1 has a hollow part is in the inside thereof. Incidentally, the hollow part is a closed space, and the pressure in the hollow part is reduced as compared with the pressure in the outside of the sensor chip 1.

The main body part 1k of the sensor chip 1 has the main surface 1ka, the back surface 1kb located opposed to the main surface 1ka, and a side surface 1kc located between the main surface 1ka and the back surface 1kb. Further, the main body part 1k of the sensor chip 1 has openings (voids, through holes) 1d formed in such a manner as to penetrate from the main surface 1ka toward the back surface 1kb, supports 1e arranged around the openings 1d, and vibration part (movable part) 1g supported by the supports 1e via a plurality of beams 1f.

The main body part 1k of the sensor chip 1 includes, for example, Si (silicon). The supports 1e, the beams 1f, and the vibration part 1g are integrally formed. The vibration part 1g is arranged in the hollow part is inside the sensor chip 1, and is supported by the beams 1f. Namely, the vibration part 1g is arranged in a mechanically operable manner in the sensor chip 1. Incidentally, the reason why the inside of the hollow part 1s is under reduced pressure resides in the purpose of reducing the resistance when the vibration part 1g oscillate.

The vibration part 1g has, for example, as shown in FIG. 2, an vibration electrode 1ga, an exciting part 1gb for applying a normal vibration along an X axis or a Y axis to the vibration electrode 1ga, and a fixed electrode 1gc directly supported by the support 1e via the beam 1f. The vibration electrode 1ga and the fixed electrode 1gc are each in the shape of comb teeth. These are arranged in opposite to each other such that the comb teeth of the one are arranged one in each space between the comb teeth of the other.

Whereas, the vibration electrode 1ga is applied with normal vibration by the exciting part 1gb, and normally vibrates along the X axis or the Y axis. FIG. 2 shows an example in which the vibration electrode 1ga normally vibrates along the Y axis. In this state, when the sensor chip 1 rotationally moves in the direction in which the Z axis shown in FIG. 2 is the rotation axis, a Coriolis force (inertial force) corresponding to the angular velocity of the rotary motion occurs in the direction perpendicular to the axis along which normal vibration occurs (in FIG. 2, the X-axis direction). When a torque due to the Coriolis force acts on the vibration electrode 1ga, the direction of vibration of the vibration electrode 1ga changes. When the direction of vibration of the vibration electrode 1ga changes, the capacitance between the vibration electrode 1ga and the fixed electrode 1gc changes accordingly. Therefore, the change in capacitance is converted into an electric signal, which can be taken out, for example, from the pad 1h of the main surface 1a via a circuit formed on the main surface 1ka of the main body part 1k.

In other words, in the sensor chip 1, the direction of vibration of the vibration electrode 1ga changes from that of normal vibration, resulting in a change in capacitance between the vibration electrode 1ga and the fixed electrode 1gc. Therefore, the sensor chip 1 is an angular velocity sensor which changes the change into an electric signal utilizing this phenomenon, and extracts the electric signal from the pad 1h.

The sensor chip 1 can be formed by using a microprocessing technique (called MEMS) for use in manufacturing of a semiconductor integrated circuit device such as a photolithography technique or an etching technique. Therefore, the sensor chip 1 has an advantage of being capable of size reduction. For example, for the sensor chip 1 of this embodiment, the planar shape of the plane crossing with the thickness direction includes a quadrangle, such as a rectangle with a length of about several millimeters per side.

Incidentally, in this embodiment, in order to briefly describe the mechanism for detecting the angular velocity of the sensor chip 1 which is an angular velocity sensor, the structure of the vibration part 1g is shown in a simplified form. Therefore, to the structure of the vibration part 1g, various modified examples are applicable.

Thus, the sensor chip 1 has the hollow part 1s formed between the main surface 1a and the back surface 1b, and the vibration part (movable part) 1g arranged in the hollow part 1s. Herein, the sensor chip 1 detects the motion of the movable part as an electric signal. Therefore, from the viewpoint of the reliability as the sensor, the following are important: with an external force, i.e., a to-be-detected object, not applied thereto, the vibration part 1g (specifically the vibration electrode 1ga) which is a movable part vibrates normally in a prescribed direction; and a prescribed distance is ensured from the fixed electrode 1gc. From this viewpoint, for a semiconductor package in which the sensor chip 1 is mounted, it is preferable to minimize other external forces than the to-be-detected objects to be applied to the main body part 1k of the sensor chip 1. Further, the sensor chip 1 tends to be deteriorated in characteristics due to the effects of noises, heat, and the like. Therefore, from this viewpoint, for a semiconductor package in which the sensor chip 1 is mounted, it is preferable that the effects of noises, heat, and the like are excluded.

<Structure of Semiconductor Device>

Figure 5:
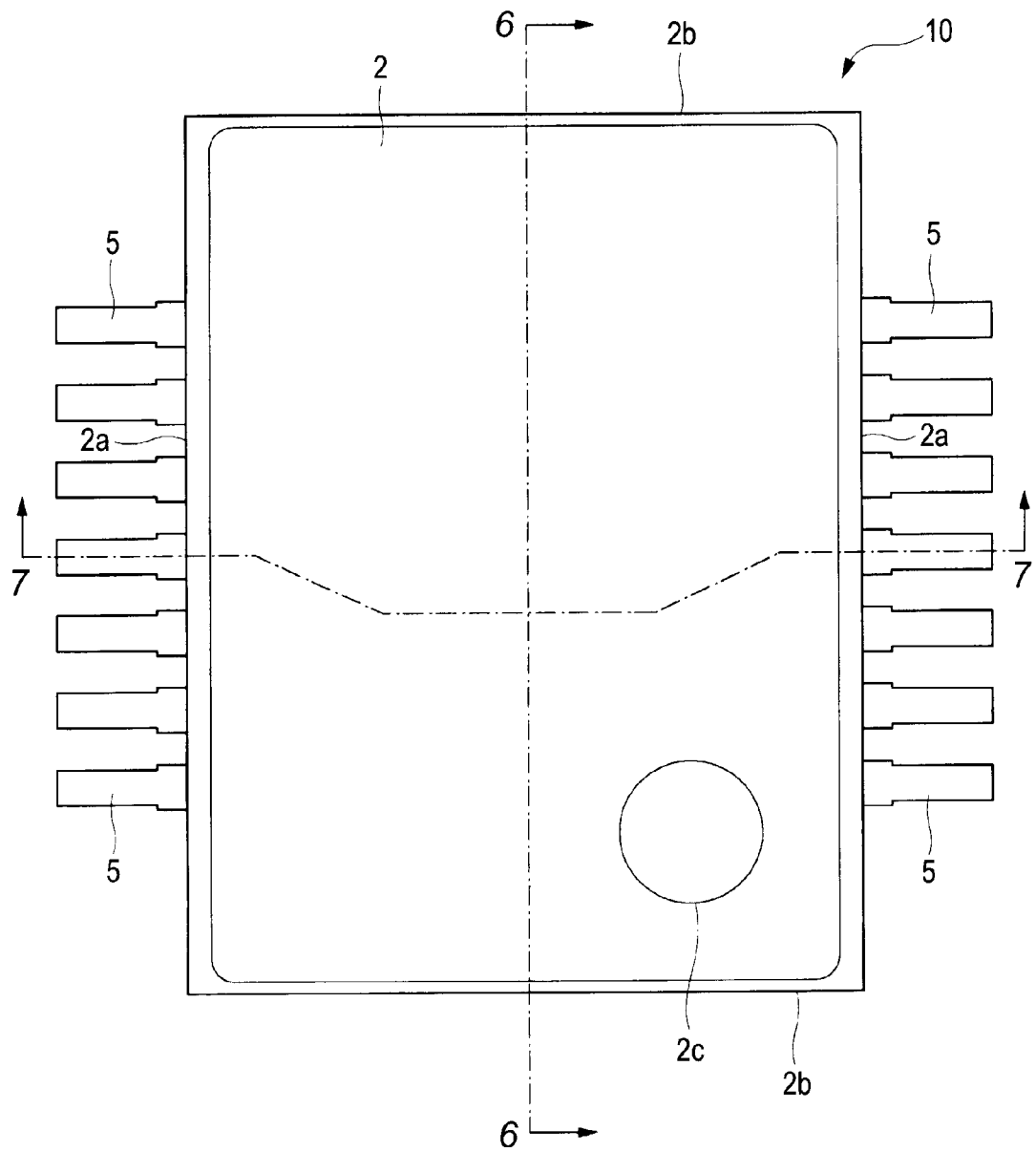
FIG. 5 is a plan view showing the upper surface side of the semiconductor device which is one example of the present invention.
Figure 6:
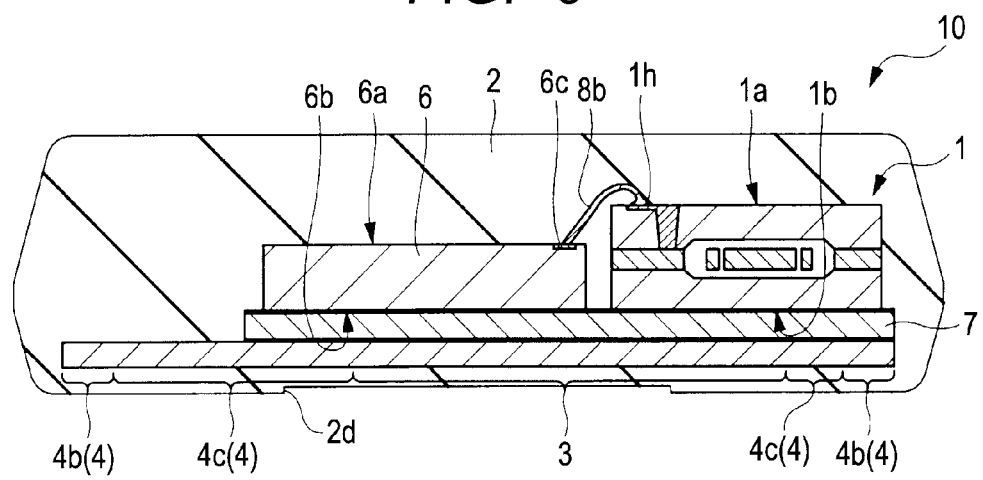
FIG. 6 is a cross sectional view along line C-C shown in FIG. 5.
Figure 7:
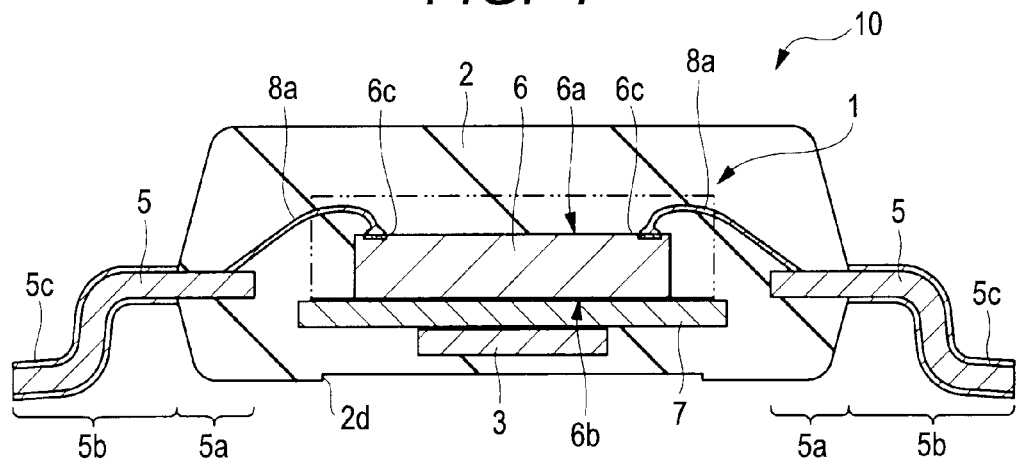
FIG. 7 is a cross sectional view along line D-D shown in FIG. 5.
Figure 8:
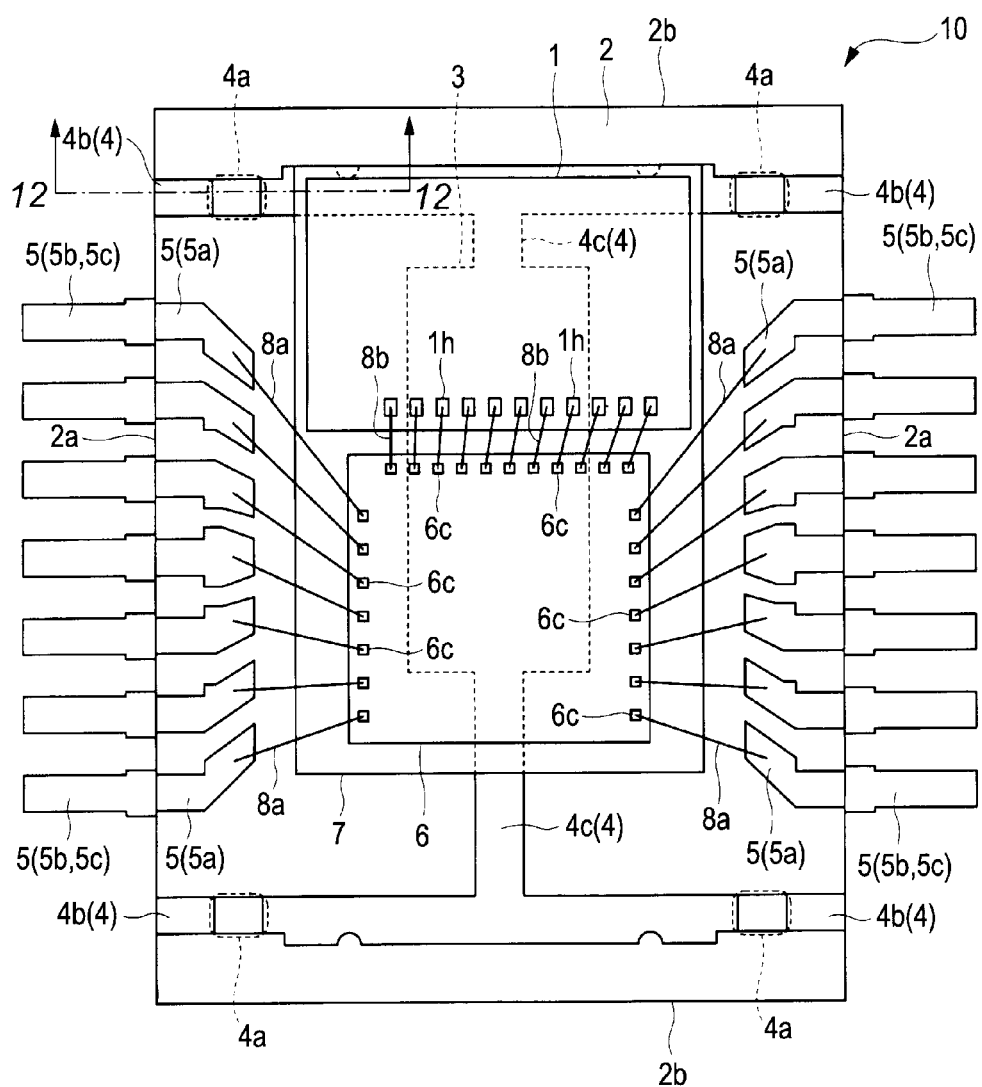
FIG. 8 is a plan view showing a planar structure in the inside of a sealing body of the semiconductor device shown in FIG. 5.

Then, by reference to FIGS. 5 to 8, a description will be given to an example of a configuration of the semiconductor device of this embodiment. FIG. 5 is a plan view showing the upper surface side of the semiconductor device of this embodiment; FIG. 6 is a cross sectional view along line C-C shown in FIG. 5; and FIG. 7 is a cross sectional view along line D-D shown in FIG. 5. Further, FIG. 8 is a plan view showing a planar structure in the inside of a sealing body of the semiconductor device shown in FIG. 5. Thus, for understanding of the configuration of the inside, FIG. 8 is a plan view showing the inside structure in perspective view through the sealing part.

The semiconductor device of this embodiment is a lead frame type semiconductor package including semiconductor chips mounted over a die pad (tab, chip mounting part) of the lead frame which is a base material. In this embodiment, a description will be given by taking a SOP (Small Outline Package) 10 which is a lead frame type semiconductor device as shown in FIG. 5 as one example thereof. The SOP has an outer shape of a quadrangle (generally a rectangle). It is a semiconductor device including a plurality of leads arranged in an array along a pair of opposing sides (generally, the long sides) out of the four sides forming the outer shape.

For the lead frame type semiconductor device, the cost reducing technologies accumulated over long years can be utilized. Further, an already formed infrastructure such as manufacturing equipment can be utilized. This can reduce the manufacturing cost as compared with a substrate type semiconductor device including semiconductor chips mounted over a wiring board.

In FIGS. 5 to 8, the SOP 10 of this embodiment includes the following configuration. First, it has a sealing body 2 having a planar shape comprised of a quadrangle. In this embodiment, the quadrangle is a rectangle, but the corner portions may be chamfered. The sealing body 2 has a pair of first sides 2a arranged opposite to each other, and a pair of second sides 2b crossing with the first sides 2a, and arranged opposite to each other at the outer periphery. Further, the SOP 10 has a die pad 3 sealed by the sealing body 2, and a plurality of suspending leads 4 extending from the die pad 3 toward the first sides 2a of the sealing body 2. Further, the SOP 10 has a plurality of leads 5 arranged between a plurality of the suspending leads 4 around the die pad 3, and arranged along the first sides 2a of the sealing body 2. A plurality of the leads 5 each have an inner lead 5a sealed by the sealing body 2, and an outer lead 5b formed integrally with the inner lead 5a, and led out from the side surface of the sealing body 2.

Further, the SOP 10 has a controller chip (first semiconductor chip) 6 having a main surface (first main surface) 6a, a plurality of pads (first electrode pads) 6c formed on the main surface 6a, and a back surface (first back surface) 6b opposed to the main surface 6a, and mounted over the die pad 3.

Whereas, the SOP 10 has a sensor chip (second semiconductor chip) 1 having a main surface (second main surface) 1a, a plurality of pads (second electrode pads) 1h formed on the main surface 1a, and a back surface (second back surface) 1b opposed to the main surface 1a, and mounted over the die pad 3. The controller chip 6 and the sensor chip 1 are arranged in an array along the first side 2a.

Whereas, in this embodiment, there is shown an example in which a silicon chip 7 is arranged between the sensor chip 1 and the controller chip 6, and the die pad 3, and the sensor chip 1 and the controller chip 6 are mounted over the silicon chip 7 via an adhesive material (not shown).

Further, a plurality of the pads 6c of the controller chip 6 are electrically coupled with a plurality of the leads 5 via a plurality of the wires (the first conductive members, the wires) 8a, respectively. Whereas, a plurality of the pads 1h of the sensor chip 1 are electrically coupled with a plurality of the pads 6c of the controller chip 6 via a plurality of the wires (the second conductive members, the second wires) 8b, respectively. Further, the die pad 3, a plurality of the suspending leads 4, a plurality of the leads 5, the controller chip 6, the sensor chip 1, and a plurality of the wires 8a and 8b are covered with the sealing body 2.

Further, each of the suspending leads 4 has an offset part 4a. As a result, the level of the die pad 3 is located at a different position from the level of the leads 5. In this embodiment, there is adopted a structure referred to as a so-called down set in which the level of the die pad 3 is located at a lower position than the level of the leads 5.

Incidentally, a pit part 2c is formed in the upper surface of the sealing body 2, and a pit part 2d is formed in the lower surface. The pit part 2c is the mark of an index pin, and the pit part 2d is the mark of an ejector pin for taking out the lead frame from the molding die.

The SOP 10 includes, in one package, the sensor chip 1, and the controller chip 6 for controlling the sensor chip 1 merged therein. Thus, by merging the sensor chip 1 and the controller chip 6 in one package, it is possible to more reduce the mounting area as compared with the case where the sensor chip 1 and the controller chip 6 are in separate packages.

Figure 9:
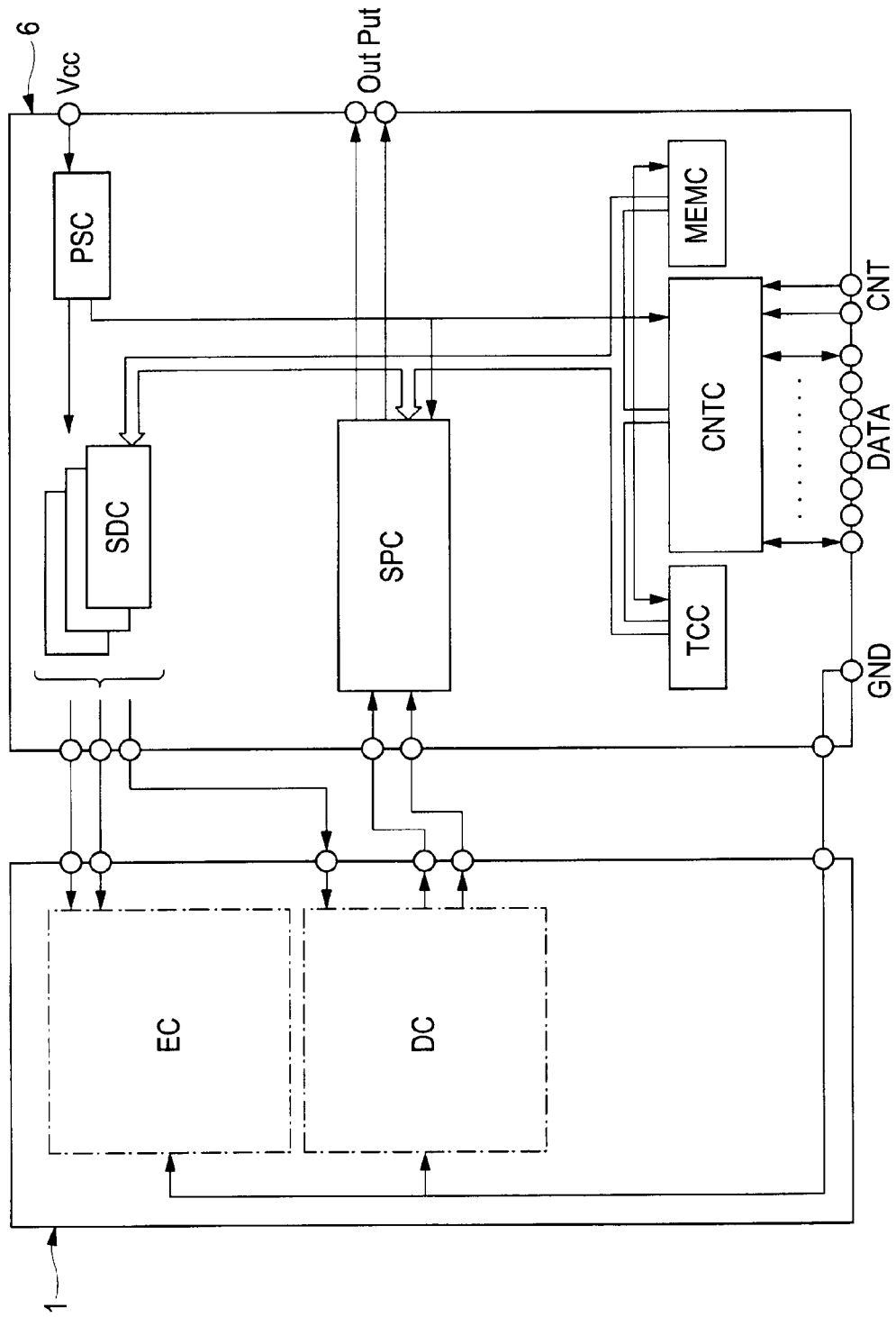
FIG. 9 is a circuit block diagram for illustrating the circuit operation in the semiconductor device shown in FIGS. 5 to 8.

Herein, prior to describing the details of respective configurations included in the SOP 10, the circuit operation of the SOP 10 will be described by reference to the circuit block diagram shown in FIG. 9. FIG. 9 is a circuit block diagram for illustrating one example of the circuit operation in the semiconductor device shown in FIGS. 5 to 8.

The sensor chip 1 is an angular velocity sensor for sensing the change in capacitance between the vibration electrode 1ga and the fixed electrode 1gc shown in FIG. 2, and detecting the angular velocity of the rotational movement with the Z axis as the central axis. Therefore, it has a detection circuit DC for detecting the change in capacitance. To the detection circuit DC, there are coupled a source potential supply circuit for supplying a source potential, a reference potential supply circuit for supplying a reference potential, and an output signal circuit through which a signal current from the detection circuit DC flows. Further, the sensor chip 1 has an exciting circuit EC for generating a normal vibration.

On the other hand, the controller chip 6 has a source potential supply circuit PSC for supplying a source potential to the controller chip 6 and the sensor chip 1, and a sensor driving circuit SDC for driving the sensor chip 1. Further, the controller chip 6 has a signal processing circuit SPC for processing an output signal from the detection circuit DC of the sensor chip 1. Further, the controller chip 6 has a control circuit CNTC for controlling respective circuits of the controller chip 6 and the sensor chip 1, and a memory circuit MEMC, and a temperature compensation circuit TCC.

As shown in FIG. 9, in this embodiment, the sensor chip 1 performs input/output of signals with external equipment via the controller chip 6, and does not perform direct input/output. On the other hand, the controller chip 6 performs input/output of signals with external equipment other than input/output of signals with the sensor chip 1. To that end, the controller chip 6 has an interface (internal interface) for the sensor chip 1, and an interface (external interface) for external equipment.

Then, the details of respective configurations will be described below. The SOP 10 shown FIGS. 5 to 8 is a lead frame type semiconductor device. Therefore, the die pad 3, the suspending leads 4, and the leads 5 respectively include the same material. As the material for the lead frame, Cu (copper or copper alloy, unless otherwise specified below, the term "Cu" herein described denotes copper or a copper alloy), a 42 alloy (iron-nickel alloy), or the like can be used. However, in this embodiment, Cu is used from the following viewpoint.

As shown in FIG. 7, over the surface of each outer lead 5b, an external plating layer 5c is formed. The external plating layer 5c is formed for improving the bonding characteristics when the SOP 10 is mounted on a mounting substrate. Therefore, the external plating layer 5c includes a bonding material for use in mounting the semiconductor device over a mounting substrate, for example, a metal material such as solder. In this embodiment, the external plating layer 5c is a so-called lead-free solder which substantially does not contain Pb (lead). Examples thereof include Sn (tin) alone, Sn (tin)-Bi (bismuth), or Sn (tin)-Ag (silver)-Cu (copper). Herein, the lead-free solder means solder having a lead (Pb) content of 0.1 wt % or less, and the content is specified as the criterion of the RoHs (Restriction of Hazardous Substances) directive.

From the viewpoint of ensuring the reliability of the SOP 10, in the external plating layer 5c, a defect such as a whisker (needle-like crystal) is preferably suppressed. However, when a 42 alloy is used as the base material of the lead 5, a whisker tends to occur as compared with the case where Cu is used. Thus, in this embodiment, Cu which can more suppress the occurrence of a defect of the external plating layer 5c, such as a whisker, is used as the material for the lead frame, i.e., the material for the die pad 3, the suspending leads 4, and the leads 5.

The die pad 3 has an upper surface, and a lower surface opposed to the upper surface. Further, the planar shape (the planar shape of the plane crossing with the thickness direction) of the die pad 3 includes a quadrangle. In this embodiment, it is a rectangle. Further, the area of the upper surface of the die pad 3 is smaller than the total area of the back surface 6b of the controller chip 6, and the back surface 1b of the sensor chip 1 to be mounted thereon. The area of the die pad 3 has a minimum necessary dimension for supporting the controller chip 6, the sensor chip 1, and the silicon chip 7. This is due to the following reason.

As described above, in this embodiment, the die pad 3 includes Cu. On the other hand, the sensor chip 1, the controller chip 6, and the silicon chip 7 include Si. The die pad 3, the sensor chip 1, the controller chip 6, and the silicon chip 7 are sealed by the sealing body 2. However, Cu to be used for the die pad 3 is lower in adhesion with a resin forming the sealing body 2 as compared with Si. For this reason, during the manufacturing step of the SOP 10, or after the completion thereof, the SOP 10 is heated, which entails a fear that peeling occurs at the adhesion interface between the die pad 3 and the sealing body 2 due to thermal expansion or thermal shrinkage. When the area of the die pad 3 is set larger than the total area of the back surface 6b of the controller chip 6, and the back surface 1b of the sensor chip 1 to be mounted thereon, it results that the back surface 6b of the controller chip 6 and the back surface 1b of the sensor chip 1 are completely covered with the upper surface of the die pad 3. In this state, when peeling occurs at adhesion interface between the die pad 3 and the sealing body 2, in the package of the SOP 10, the positions of the die pad 3, and the sensor chip 1, the controller chip 6 to be mounted thereon become instable, which causes a reduction of the reliability of the SOP 10. For example, when the sensor chip 1 moves a little in the SOP 10, a stress occurs accordingly. This entails a fear that the correct dynamic amount become unable to be detected by the sensor chip 1. Incidentally, when the die pad 3 is formed of a 42 alloy, the adhesion can be more improved as compared with Cu. However, the adhesion between Si and the sealing body 2 is higher than the adhesion between the 42 alloy and the sealing body 2. For this reason, even in this case, the area of the die pad 3 is preferably reduced.

Thus, in this embodiment, the area of the die pad 3 is set smaller than the total area of the controller chip 6 and the sensor chip 1. In other words, the die pad 3 is formed in such a shape that the back surface of the silicon chip 7 is in contact with the sealing body 2. This reduces the adhesion area of Cu and the sealing body 2, which improves the stability of the positions of the sensor chip 1 and the controller chip 6 in the package of the SOP 10.

Whereas, Cu is largely different in linear expansion coefficient from Si. Therefore, during the manufacturing step of the SOP 10, or after the completion thereof, when the SOP 10 is heated, a stress occurs due to the difference in linear expansion coefficient between respective constituent materials. Particularly, when the sensor chip 1 is directly mounted on the die pad 3, a stress tends to occur in the sensor chip 1, which causes a reduction of the reliability.

Thus, in this embodiment, between the sensor chip 1 and the die pad 3, a silicon chip 7 is arranged (bonded), so that the sensor chip 1 is bonded on the silicon chip 7. In other words, the silicon chip 7 functions as a linear expansion coefficient adjusting member for compensating for the difference in linear expansion coefficient from the sensor chip 1, and prevents or suppresses transmission of the stress occurring due to the difference in linear expansion coefficient from the die pad 3 to the sensor chip 1.

The silicon chip 7 preferably has a thickness equal to or larger than the thickness of the die pad 3 from the viewpoint of making it difficult for the stress occurred between it and the die pad 3 from being transmitted to the sensor chip 1. Further, the silicon chip 7 has, as described above a function as the linear expansion adjusting member. Therefore, a material close in linear expansion coefficient to the sensor chip 1, in particular preferably, the same material as the semiconductor material forming the sensor chip 1 is preferably used. For example, in this embodiment, the sensor chip 1 includes Si, and hence the silicon chip 7 is formed of Si. However, in the case where the sensor chip 1 includes a semiconductor material other than Si, when the material for the silicon chip 7 is also the same semiconductor material as this, the difference in linear expansion coefficient can be more adjusted. However, even when the sensor chip 1 and the silicon chip 7 respectively include different semiconductor materials, they are more close in linear expansion coefficient to each other than to the die pad 3. Therefore, as compared with the case where the sensor chip 1 is directly bonded to the die pad 3, transmission of the stress to the sensor chip 1 can be more suppressed. Accordingly, Si which is available at a relatively low cost is preferable as the material for the silicon chip 7 from the viewpoint of reducing the raw material cost of the SOP 10.

Whereas, the area of the upper surface of the silicon chip 7 is larger than the area of the back surface 1b of the sensor chip 1. Thus, the back surface 1b is entirely covered with the silicon chip 7. By thus covering the back surface 1b of the sensor chip 1 with the silicon chip 7, it is possible to suppress the transmission of the stress to the sensor chip 1 with more reliability.

Incidentally, when the die pad 3 is formed of a 42 alloy, it is more close in linear expansion coefficient to the sensor chip 1 than Cu. Therefore, for example, it is also possible to bond the sensor chip 1 directly to the die pad 3 not via the silicon chip 7. However, even when the die pad 3 is formed of a 42 alloy, the sensor chip 1 is more preferably mounted over the die pad 3 via the silicon chip 7 because the transmission of the stress can be more suppressed thereby.

Further, the silicon chip 7 is also preferable from the viewpoint of reducing the stress to be applied to the sensor chip 1 from the sealing body 2. Namely, the sealing body 2 and the sensor chip 1 are largely different in linear expansion coefficient from each other. Therefore, as described above, when the SOP 10 is heated, a shrinkage stress occurs in the sealing body 2 due to the difference in the linear expansion coefficient. Herein, the silicon chip 7 covers the entire back surface 1b of the sensor chip 1, so that the sensor chip 1 is bonded to the silicon chip 7. Therefore, when the shrinkage stress of the sealing body 2 occurs, the silicon chip 7 functions as a reinforcing member for suppressing the deformation of the sensor chip 1. Also from the viewpoint as the reinforcing member, the thickness of the silicon chip 7 is preferably increased. However, in this embodiment, the silicon chip 7 has a larger thickness than the thickness of the die pad 3. This can reinforce the strength of the sensor chip 1.

Incidentally, in this embodiment, over the silicon chip 7, the sensor chip 1 and the controller chip 6 are bonded. Further, the back surface 6b of the controller chip 6 is also entirely covered with the upper surface of the silicon chip 7. For this reason, the area of the upper surface of the silicon chip 7 is larger than the total area of the back surface 1b of the sensor chip 1 and the back surface 6b of the controller chip 6. Thus, by also arranging the controller chip 6 over the silicon chip 7, in addition to the sensor chip 1, it is possible to make the pad 6c of the controller chip 6 close in height to the pad 1h of the sensor chip 1. As a result, it is possible to shorten the length of the wire 8b for coupling the sensor chip 1 and the controller chip 6.

The controller chip 6 is a semiconductor chip for control, and does not have the hollow part is or the movable part (vibration part 1g) in the inside thereof as with the sensor chip 1. Therefore, the thickness of the sensor chip 1 is larger than the thickness of the controller chip 6. Accordingly, when the sensor chip 1 is bonded on the silicon chip 7, and the controller chip 6 is directly bonded on the die pad 3, the difference in height between the level of the main surface 1a of the sensor chip 1 and the main surface 6a of the controller chip 6 also increases. This also results in a larger difference in height between the pads 1h and 6c formed on respective main surfaces 1a and 6a, respectively. Accordingly, the wire 8b for electrically coupling between the pads 1h and 6c increases in length. When the length of the wire 8b increases, in the step of forming the sealing body 2 (details of which will be described later), the wire 8b is deformed by the injection pressure from the sealing resin to be injected. This increases a risk of occurrence of breakage of the bonding part with the pads 1h and 6c, or poor connection such as a short circuit between the wires 8b arranged adjacent to each other. Thus, in this embodiment, by also bonding the controller chip 6 over the silicon chip 7, the pad 6c of the controller chip 6 is made close in height to the pad 1h of the sensor chip 1, thereby to shorten the length of the wire 8b.

For the controller chip 6, the planar shape of the plane crossing with the thickness direction includes a quadrangle. In this embodiment, for example, the quadrangle is a square with a length of about several millimeters per side. For the material of the controller chip 6, silicon (Si) is used.

Whereas, over the main surface 6a of the controller chip 6, various circuits for controlling and driving the sensor chip 1 and the controller chip 6 are formed. Further, over the main surface 6a, a plurality of pads to be electrically coupled with various circuits are formed. A plurality of the pads 6c are electrically coupled to a plurality of leads 5 via the wires 8a which are respectively conductive members.

Herein, as described above, in this embodiment, the input/output of signals with external equipment in the sensor chip 1 is performed via the controller chip 6. Therefore, all the wires 8b to be bonded to a plurality of the pads 1h are bonded with the pads 6c of the controller chip 6. Further, for the sensor chip 1, the number of terminals (number of the pads 1h) can be relatively reduced. For this reason, a plurality of the pads 1h are arranged in an array along the side closest to the controller chip 6 in the outer edge of the main surface 1a having the shape of a quadrangle. Further, out of a plurality of the pads 6c of the controller chip 6, the pads 6c serving as internal interfaces for the sensor chip 1 are arranged in an array along the side closest to the sensor chip 1 in the outer edge of the main surface 6a having the shape of a quadrangle. In other words, a plurality of the pads 1h of the sensor chip 1 and a plurality of internal interface pads 6c of the controller chip 6 are arranged opposite to each other. This can shorten the length of each wire 8b. Accordingly, the inductance of the wire 8b can be reduced. Further, respective wires 8b can be made uniform in length, and hence impedance matching can be achieved.

Whereas, out of a plurality of the pads 6c of the controller chip 6, the pads 6c serving as external interfaces are arranged in an array along the side closest to the leads 5 to be respectively coupled thereto via the wires 8a in the outer edge of the main surface 6a having the shape of a quadrangle. In the SOP 10, the leads 5 are led out in groups of a plurality of leads from the side surfaces on the sides of a pair of the first sides 2a, respectively. Therefore, a plurality of external interface pads 6c are arranged in an array along the side closest to a pair of the first sides 2a. This can reduce the length of each wire 8a, which can reduce the inductances of the wires 8a.

Further, in this embodiment, a plurality of the leads 5 are coupled to the controller chip 6, and are not directly coupled with the sensor chip 1. Therefore, the leads 5 are arranged close to the controller chip 6. In other words, a plurality of leads 6 are not arranged in a dispersed manner along the opposite side surfaces on the sides of the first sides 2a of the sealing body 2, but are arranged in a gathered manner in the vicinity of the controller chip 6. As a result, the lengths of the wires 8a can be made uniform, so that matching of inductances can be achieved. further, the length of each wire 8a can be shortened, which can reduce the inductance of each wire 8a. Whereas, the reduction in length of each wire 8a can prevent or inhibit the following: in a sealing step described later, each shape (wire loop shape) of wires 8b for coupling the controller chip 6 and the leads 5 is lost. This may cause a short circuit between the adjacent wires or between the sensor chip 1 and the wires 8a.

The SOP 10 uses, as a means for gathering the leads 5 in the vicinity of the controller chip 6, the following method is used. Namely, the SOP 10 of this embodiment is relatively narrower in arrangement pitch of a plurality of the leads 5 which are external coupling terminals (the intercenter distance between the adjacent leads 5) than a general SOP. For example, the arrangement pitch of leads of a general SOP is 1.27 mm. In contrast, for the SOP 10, the arrangement pitch is 1 mm or narrower, or 0.65 mm. Thus, the package, in which the arrangement pitch of a plurality of the leads 5 which are external terminals has been narrowed, is particularly referred to as a SSOP (Shring Small Outline Package).

For the SSOP, by narrowing the arrangement pitch of the leads, the number of the alignable leads is increased. Therefore, the SSOP is generally applied to a semiconductor device generally requiring a large number of terminals. However, the present inventors adopts the SSOP for the purpose of gathering the leads 5 in the vicinity of the controller chip 6. For example, for the SOP 10 of this embodiment, the number of the necessary external terminals is 14. However, for the lead frame used in manufacturing of the SOP 10, there is used a lead frame (22-pin lead frame) having dimensions allowing formation of 22 leads larger in number necessary external terminals.

Thus, by using the lead frame having dimensions allowing the formation of leads larger in number than necessary external terminals, it is possible to gather the leads 5 at the periphery of the controller chip 6. Specifically, unnecessary leads (leads not to be coupled with the controller chip 6) are removed (or unnecessary leads are not formed when leads are formed). As a result, as shown in FIG. 8, the number of leads 5 arranged closer to the sensor chip 1 (than to the controller chip 6) is smaller than that of the leads 5 arranged closer to the controller chip 6 (than to the sensor chip 1).

Further, use of the SSOP can narrow the arrangement pitch of the adjacent leads 5. This can suppress the increase in dimension as the entire package.

Figure 10:
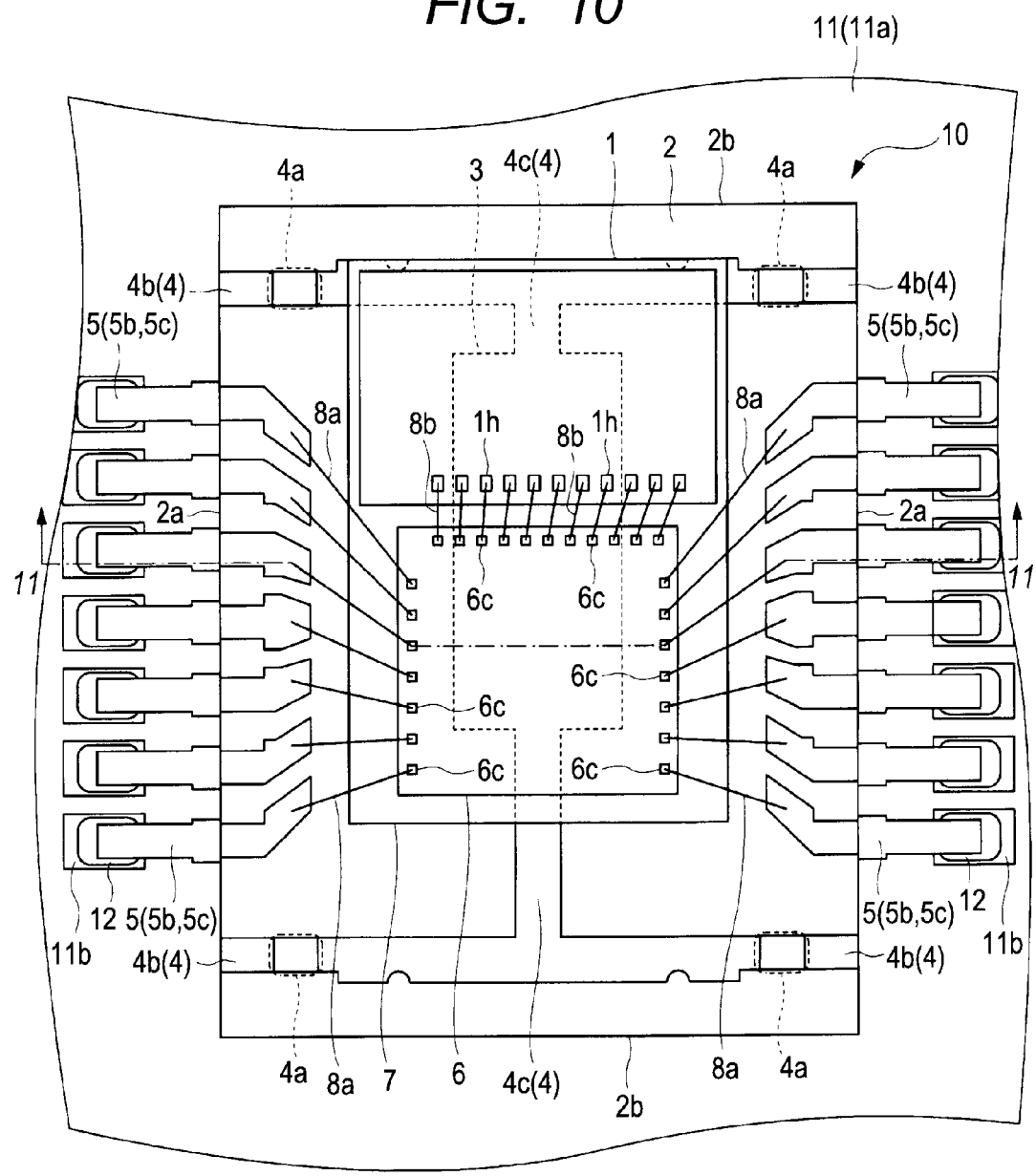
FIG. 10 is an enlarged perspective plan view of an essential part showing a state in which a SOP shown in FIGS. 5 to 8 is mounted over a mounting substrate.
Figure 11:
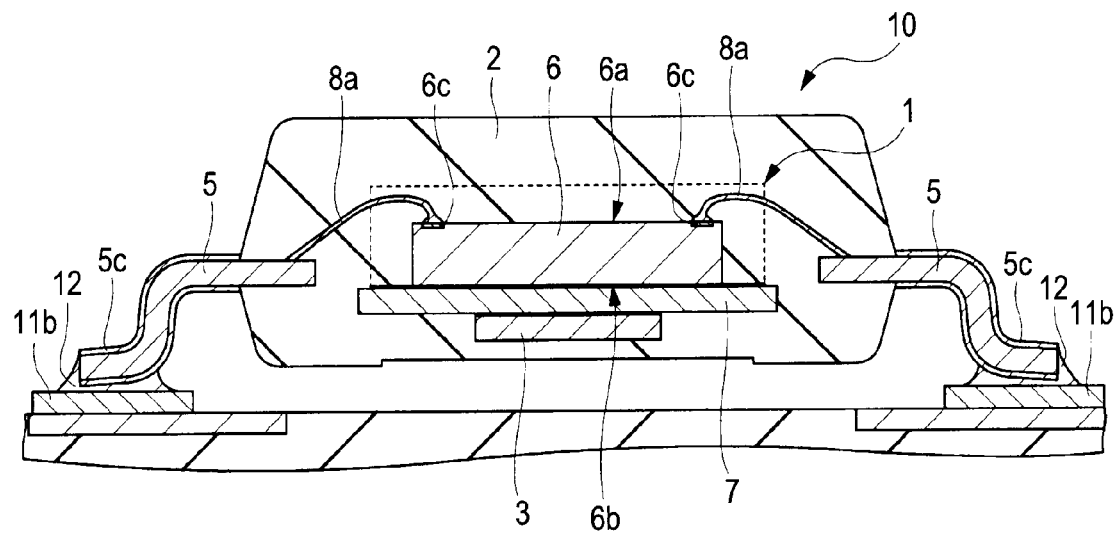
FIG. 11 is an enlarged cross sectional view of an essential part along line D-D shown in FIG. 10.

Whereas, the number of the leads 5 arranged close to the sensor chip 1 is set smaller than that of the leads 5 arranged close to the controller chip 6. This can reduce the stress to be transmitted to the sensor chip 1 from the leads 5 when the SOP 10 is mounted over a mounting substrate. Below, a description will be given by reference to FIGS. 10 and 11. FIG. 10 is an enlarged perspective plan view of an essential part showing a state in which the SOP shown in FIGS. 5 to 8 is mounted over a mounting substrate; and FIG. 11 is an enlarged cross sectional view of an essential part along line D-D shown in FIG. 10. Incidentally, for understanding of the configuration of the inside, FIG. 10 is a plan view showing the inside structure in perspective view through the sealing part.

In FIGS. 10 and 11, the SOP 10 is mounted over a mounting substrate 11. Specifically, a plurality of leads 5 included in the SOP 10 are bonded to the lands 11b formed on a main surface 11a of the mounting substrate 11 by a bonding material 12 such as solder, so that the SOP 10 is fixed over the mounting substrate 11. Therefore, a plurality of the leads 5 also have a function as a support member for fixing the SOP over the mounting substrate 11 in addition to the function as a conductive path for electrically coupling between the mounting substrate 11 and the SOP 10.

Therefore, when deformation such as so-called warpage of the mounting substrate 11 occurs, the stress caused by the deformation is transmitted to the inside of the SOP 10 via a plurality of the leads 5 and the sealing body 2. The effect by the transmitted stress increases with a decrease in distance from the leads 5. Further, the effect increases with an increase in number of the leads 5 arranged in the periphery thereof.

For this reason, as with the SOP 10, the number of the leads 5 arranged close to the sensor chip 1 is set smaller than that of the leads 5 arranged close to the controller chip 6. This can reduce the stress to be transmitted to the sensor chip 1 from the leads 5.

Incidentally, when the sensor chip 1 and the controller chip 6 are arranged side by side, in view of the arrangement balance of respective chips (the sensor chip 1 and the controller chip 6), it is conceivable that the gap between respective chips is located in the vicinity of the central part of the SOP 10. For example, as with a SOP 30 shown in FIG. 27 which is a comparative example relative to this embodiment, there can be considered a structure in which the gap between the sensor chip 1 and the controller chip 6 is located on a line coupling the respective centers of a pair of first sides 2a.

However, in this embodiment, there is adopted a configuration in which the leads 5 having a function as a support member for mounting the SOP 10 over the mounting substrate 11 are gathered in the periphery of the controller chip 5. Further, from the viewpoint of reducing the transmission of the stress from the mounting substrate 11, the number of the leads in the periphery of the sensor chip 1 is more preferably smaller. For this reason, with the structure as in the SOP 30, the positions of the leads 5 are gathered to one side, resulting in poor stability of the SOP 30 over the mounting substrate 11. As a result, when a force is applied to the side on which the leads 5 are not arranged for mounting the SOP 10 over the mounting substrate 11, or after mounting, peeling may occur at the bonding part between the leads 5 and the lands 11b. In other words, the mounting reliability is reduced.

Thus, in this embodiment, the controller chip 6 is arranged at the middle (the middle in the plane coordinates) of the SOP 10 in plan view. As a result, a plurality of the leads 5 arranged close to the controller chip 6 are arranged in a manner gathered to the middle of the SOP 10. This can improve the stability of the SOP 10 over the mounting substrate 11. Therefore, the mounting reliability can be more improved as compared with the SOP 30 shown in FIG. 27.

Further, a thickness of the sensor chip 1 is, as described above, larger than that of the controller chip 6. When the semiconductor chip (sensor chip 1) thus having a large thickness is sealed with the sealing body 2, in order to allow a sealing resin to spread throughout therein in the step of forming the sealing body 2, a part of each suspending lead 4 is preferably bent so that the level of the die pad 3 is at a different position from that of the level of the leads 5. Particularly, in this embodiment, between the die pad 3 and the sensor chip 1, the silicon chip 7 is arranged. Therefore, the total thickness of the members arranged over the die pad 3 becomes larger as compared with the case where the sensor chip 1 is directly bonded on the die pad 3. Therefore, from the viewpoint of preventing the occurrence of defects due to incomplete filling with a sealing resin in the step of forming the sealing body 2, it is preferable to allow a large difference between the height of the die pad 3 and the height of the lead 5.

Figure 12:
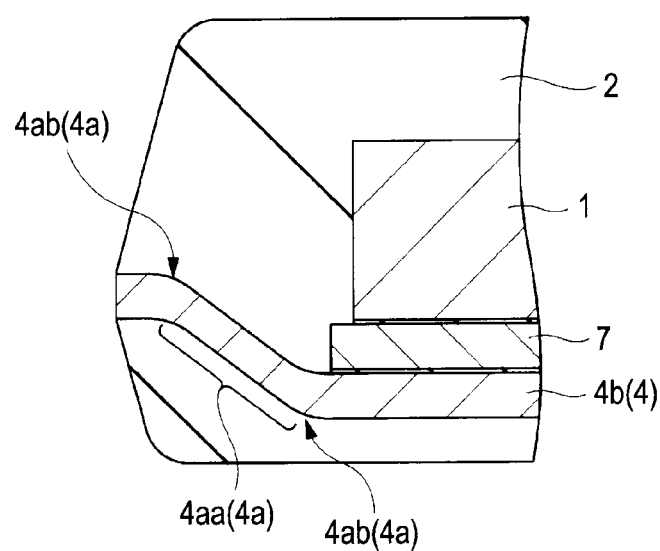
FIG. 12 is an enlarged cross sectional view of an essential part along line E-E shown in FIG. 8.

FIG. 12 is an enlarged cross sectional view of an essential part along line E-E shown in FIG. 8. In this embodiment, a part of each suspending lead 4 is subjected to bending (down setting) working so that the height of the die pad 3 is smaller than the height of the lead 5. Then, by the bending working, at a part of each of a plurality of the suspending dies 4 supporting the die pad 3, an offset part 4a is formed. The offset part 4a has a tilt portion 4aa, and bent portions 4ab at two sites located on the both sides of the tilt portion 4aa. In the suspending lead 4, the region on the side closer to the die pad 3 than the offset part 4a is lower in height than the leads 5. Whereas, the region on the side more distant from the die pad 3 than the offset part 4a is as high as the leads 5.

Whereas, the SOP 10 has, as the suspending leads 4 supporting the die pad 3, first suspending leads 4b extending along a first direction toward the first sides 2a of the sealing body 2, and second suspending leads 4c extending along a second direction crossing with the first direction. The first and second suspending leads 4b and 4c are integrally formed. The offset parts 4a are formed in the first suspending leads 4b, and are not formed in the second suspending leads 4c. For this reason, the second suspending leads 4c are located at the same height as that of the die pad 3, so that the silicon chip 7 is also bonded on the second suspending leads 4c. The first suspending leads 4b are coupled to the die pad 3 via the second suspending leads 4c.

In this embodiment, from the viewpoint of improving the adhesion with the sealing body 2, the die pad 3 and the first suspending leads 4b are coupled via the second suspending leads 4c narrower in width than the die pad 3 in order to hold the area of the die pad 3 to the minimum necessary level. Further, by also bonding the silicon chip 7 over the suspending leads 4, it is possible to improve the stability for mounting the silicon chip 7 over the die pad 3.

Figure 27:
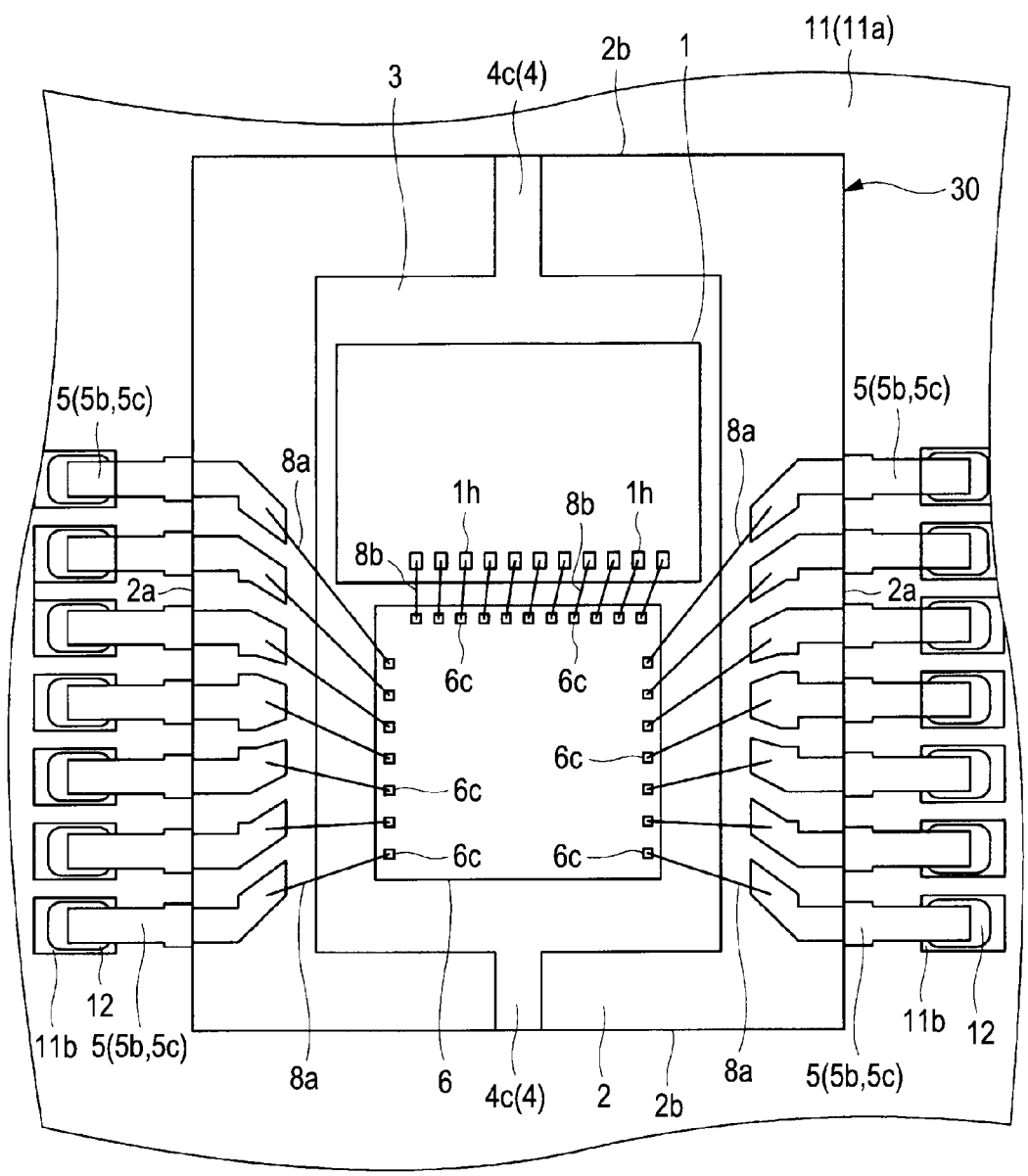
FIG. 27 is a perspective plan view showing the inside structure of a semiconductor device which is a comparative example relative to one embodiment of the present invention.

Herein, in general, in the SOP in the planar shape of a rectangle, as with the SOP 30 shown in FIG. 27 which is a comparative example relative to this embodiment, the suspending leads 4 are arranged in such a manner as to extend toward the short sides (second sides 2b) along which a plurality of the leads 5 are not arranged. This is for the following purpose: by allowing the suspending leads 4 to extend in the direction of the second sides 2b along which the leads 5 are not arranged, the arrangement space for the leads 5 is expanded.

However, as a result of the study by the present inventors, the inventors found the following: in the SOP 10, when the first suspending leads 4b having the offset parts 4a are allowed to extend toward the second sides 2b, the following new problem occurs. Namely, unfavorably, the space for forming the offset part 4a cannot be ensured.

The offset part 4a is formed by subjecting the suspending leads 4 to bending working as described above. When the suspending leads 4 are subjected to bending working, the material in the periphery of the bent portions 4ab of the offset part 4a elongates. For this reason, when the tilt angle of the tilt portion 4aa of the offset part 4a is made sharp, the suspending lead 4 may be broken.

The study by the present inventors proved the following: when the tilt angle of the tilt portion 4aa with respect to the upper surface of the die pad 3 exceeds 45 degrees, the suspending leads 4 are broken. Therefore, in order to reduce the height of the die pad 3 while preventing the breakage of the suspending leads 4, a space at least equal to or larger than the difference in height between the die pad 3 and the leads 5 becomes necessary as the space for arranging the offset part 4a.

However, in the SOP 10, the controller chip 6 is arranged at generally the center, and the sensor chip 1 is arranged lateral thereto. Therefore, it is difficult to ensure a space for forming the offset parts 4a in the longitudinal direction, namely, in the direction along the first sides 2a. Further, in the SOP 10, the sensor chip 1 thicker than the controller chip 6 is arranged over the silicon chip 7. This increases the difference in height between the die pad 3 and the leads 5. Therefore, it is necessary to allow a wide space for arranging the offset parts 4a. For this reason, for example, in order to form the offset parts 4a in the second suspending leads 4c shown in FIG. 8, it is necessary to further elongate the length in the longitudinal direction of the SOP 10. This results in a large overall dimension of the SOP 10.

Thus, in this embodiment, a plurality of the first suspending leads 4b forming the offset parts 4a were respectively arranged in such a manner as to extend toward the first sides 2a. In other words, a plurality of the first suspending leads 4b included in the SOP 10 respectively extend in the direction crossing with the direction of array of a plurality of semiconductor chips (the sensor chip 1 and the controller chip 6). This can minimize the package dimension of the SOP 10, and can ensure the space for the offset parts 4a necessary from the viewpoint of prevention of breakage of the suspending leads 4.

Further, in the SOP 10, a plurality of (two in FIG. 8) the suspending leads 4 are respectively arranged in such a manner as to extend toward respective ones of a pair of the first sides 2a. For this reason, as compared with the case where one suspending lead 4 is arranged in such a manner as to extend toward each of a pair of the first sides 2a, the die pad 3 can be held more securely.

Figure 13:
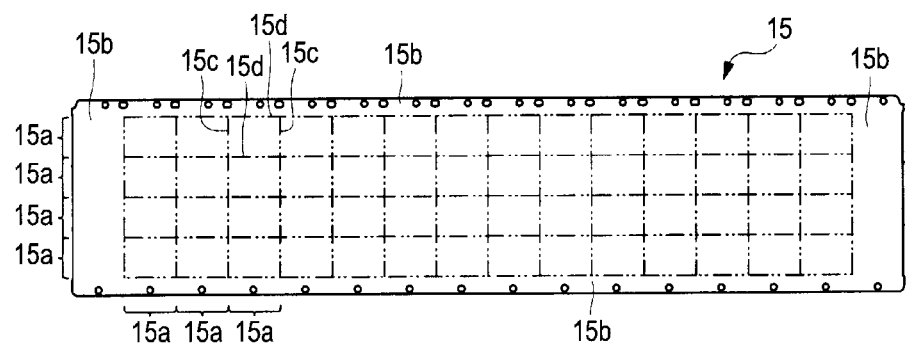
FIG. 13 is a plan view showing the outline of the overall structure of a lead frame for use in manufacturing of a semiconductor device which is one embodiment of the present invention.
Figure 14:
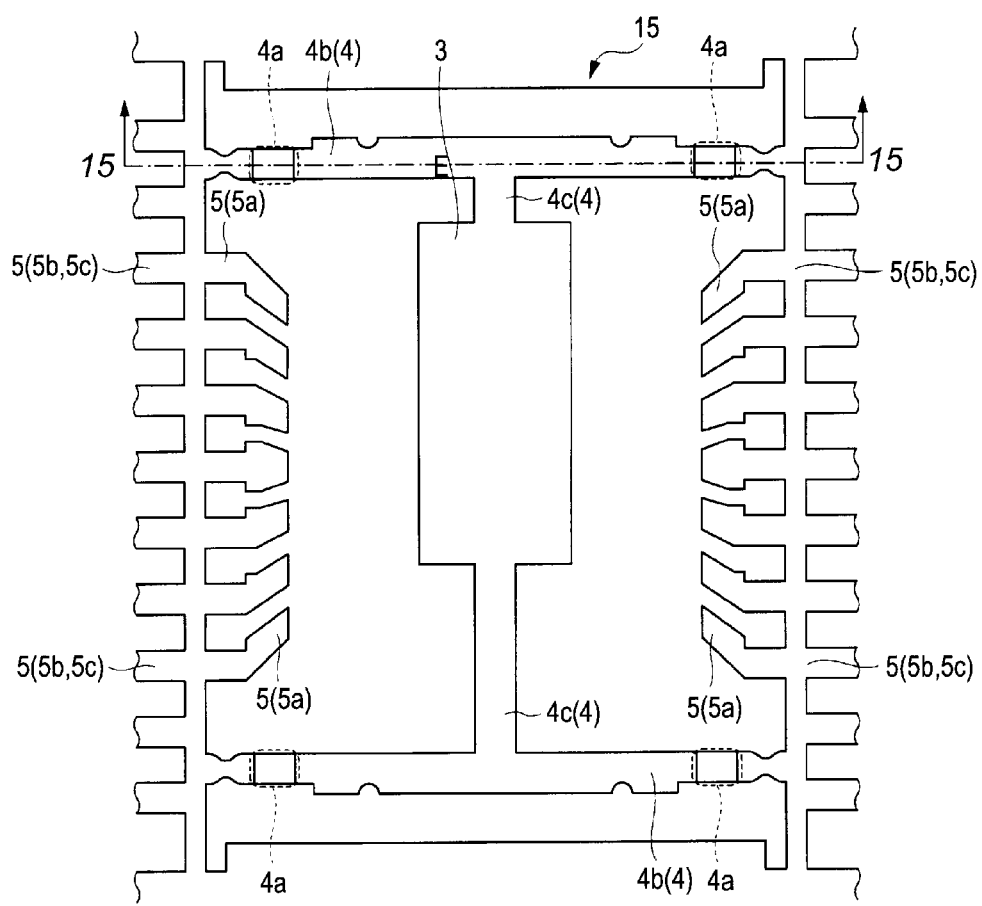
FIG. 14 is an enlarged plan view showing a part of the product forming region shown in FIG. 13 on an enlarged scale.
Figure 15:
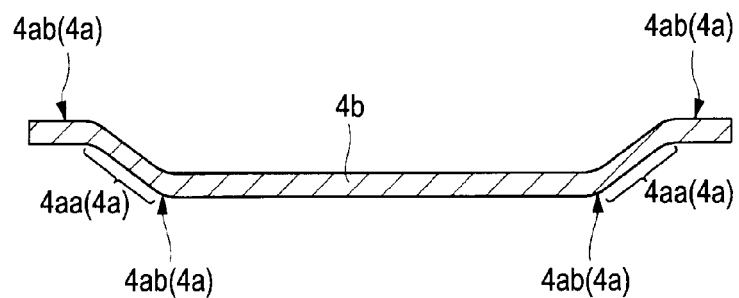
FIG. 15 is an enlarged cross sectional view along line F-F shown in FIG. 14.

<Manufacturing method of semiconductor device> Then, a description will be given to a manufacturing method of the SOP 10 shown in FIGS. 5 to 8. First, a lead frame 15 shown in FIGS. 13 to 15 is prepared (lead frame preparation step). FIG. 13 is a plan view showing the outline of the overall structure of the lead frame for use in manufacturing of the semiconductor device of this embodiment; FIG. 14 is an enlarged plan view showing a part of the product forming region shown in FIG. 13 on an enlarged scale; and FIG. 15 is an enlarged cross sectional view along line F-F shown in FIG. 14.

The SOP 10 of this embodiment is an acceleration sensor to be mounted in, for example, a car navigation device, a DVC (Digital Video Camera), a cellular phone, and a game, and has a relatively small number of external coupling terminals. For example, in the SOP 10 shown in FIGS. 5 to 8, the number of the leads 5 is 14. In the case of a semiconductor device having such a small number of terminals, a lead frame is preferably used from the viewpoint of reducing the manufacturing cost.

For example, the lead frame 15 shown in FIGS. 13 to 15 can be formed by press working. Specifically, the shapes of the die pad 3, the leads 5, the suspending leads 4, and the like can be formed as shown in FIG. 14 by pressing a metal plate serving as the base material of the lead frame 15 with a die. The press working is capable of mass production with a die, and hence can reduce the manufacturing cost of the lead frame 15. Incidentally, advance of semiconductor device scaling also causes a limit in working precision in press working which is a mechanical forming means. Thus, as a method for performing more precise processing, an etching process which is a chemical forming means may be used.

The lead frame 15 prepared in this step has a plurality of product formation regions (device formation regions) 15a (respective regions surrounded by a two-dot chain line in FIG. 13). Each product formation region 15a corresponds to one semiconductor device (SOP 10) shown in FIGS. 5 to 8. Further, each product formation region 15a is in the planar shape of a quadrangle including a pair of first sides 15c, and a pair of second sides 15d crossing with the first sides 15c. Respective product formation regions 15a are combined and supported by a frame body 15b. Further, as shown in FIG. 13, respective product formation regions 15a are arranged in a matrix. FIG. 13 shows a structure in which the product formation regions 15a are arranged in a matrix, four in the column direction, and 14 in the row direction.

Whereas, as shown in FIG. 14, a plurality of the product formation regions 15a included in the lead frame 15 each have a die pad (chip mounting part) 3. Further, the product formation regions 15a each have a plurality of suspending leads 4 extending toward the first sides 15c (see FIG. 13) of each product formation region (see FIG. 13) from the die pad 3, and respectively having the offset parts 4a. Still further, the product formation regions 15a each have a plurality of leads 5 arranged around the die pad 3, and at a different height from that of the die pad 3 along the first sides 15c of each product formation region 15a. Whereas, the frame body 15b included in the lead frame 15 is formed integrally with a plurality of the leads 4 and a plurality of the leads 5.

The lead frame 15 shown in FIGS. 13 to 15 is obtained, for example, in the following manner. First, a thin plate of copper type (e.g., copper alloy, or the one obtained by forming a plating layer of Ni or the like on the surface of copper), or of iron type (e.g., 42 alloy) is prepared to form the inner leads 5a, the outer leads 5b, the die pads 3, the suspending leads 4, and the like by press working or etching working.

In this embodiment, as described above, the lead frame 15 for SSOP is used. Therefore, a plurality of the leads 5 are arranged in arrays each including a plurality of the leads 5 along respective lines (lead array lines) along a pair of opposing sides of the four sides forming the outer shape of the die pad 3.

Further, the lead frame 15 has dimensions allowing the formation of 22 leads larger in number than the external terminals (14) necessary in the SOP 10 shown in FIGS. 5 to 8. In other words, the 22-pin lead frame 15 is used. For this reason, as shown in FIG. 14, the outer leads 3b are formed in a total number of 22, 11 outer leads per side. Incidentally, unnecessary outer leads 5b (not to be used as external terminals) are cut and removed in a singulation step described later.

Whereas, the suspending leads 4 have first suspending leads 4b extending along a first direction toward the lead array lines including a plurality of the leads 5 arrayed therein (toward the first sides 15c shown in FIG. 13), and second suspending leads 4c extending along a second direction crossing with the first direction (toward the second sides 15d shown in FIG. 13). The first and second suspending leads 4b and 4c are integrally formed. The offset parts 4a are formed in the first suspending leads 4b, and are not formed in the second suspending leads 4c. For this reason, the second suspending leads 4c are located at the same height as that of the die pad 3. As a result, as shown in FIG. 12, the silicon chip 7 can be mounted over the second suspending leads 4c, and the first suspending leads 4b.

Further, in this embodiment, the first suspending leads 4b are arranged two for each of a pair of the first sides 15c. This can improve the support strength of the die pad 3.

Then, as a plating layer formation step, a plating layer (e.g., a silver-plating layer) for improving the bonding strength with the wires 8 (see FIG. 8) is formed in a part of each inner lead 5a.

Then, as an offset step, the planar position of the die pad 3 is offset (in this embodiment, an example of down setting is shown, but upsetting is also acceptable) from the planar position of each inner lead 5a. In this step, in a plurality of the suspending leads 4 (specifically, the first suspending leads 4b), the tilt portions 4aa and the bent portions 4ab are formed, respectively. As a result, the planar position of the die pad 3 is offset at a different position from the planar position of each inner lead 5a. The offset method can be accomplished by, for example, subjecting a prescribed position of each first suspending lead 4b to bending working using a punch and a die.

Herein, in this step, in order to ensure the height at which the silicon chip 7 (see FIG. 12) is arranged, the difference in height between the position of the upper surface of the die pad 3 and the position of the upper surface of the inner lead 5 is set equal to or larger than, for example, the thickness of the controller chip 6. However, when the tilt angle of the tilt portion 4aa of each offset part 4a exceeds 45 degrees, the suspending leads 4 are broken in this step.

Thus, in this embodiment, the offset parts 4a are formed only in the first suspending leads 4b extending toward the lead array lines. This ensures a space for setting the tilt angle of the tilt portion 4aa at 45 degrees or less.

Completion of the offset step results in the lead frame 15 in which the planar position of the die pad 3 has been offset from the planar position of the inner lead 5a.

Figure 16:
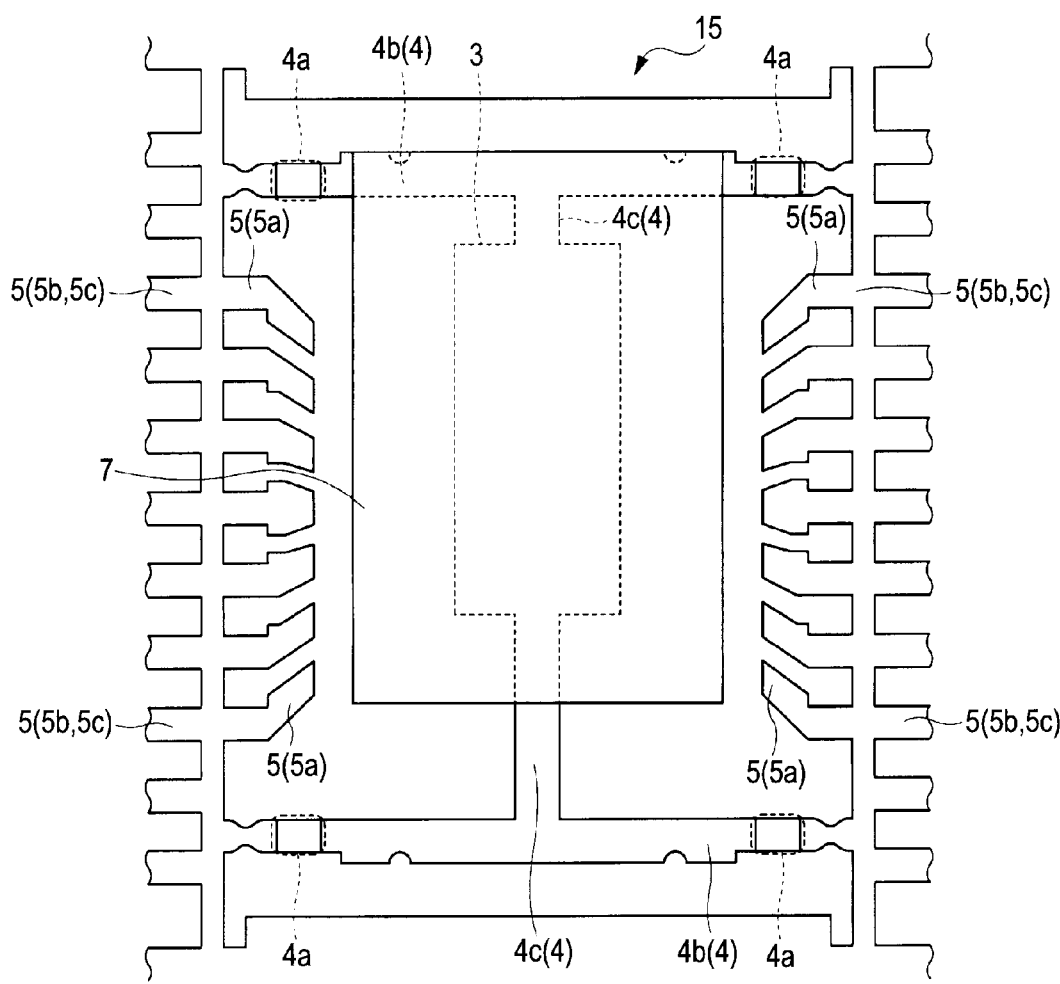
FIG. 16 is an enlarged plan view showing a state in which a silicon chip is mounted over the lead frame shown in FIG. 14.

Then, as shown in FIG. 16, a silicon chip 7 is prepared, and mounted over the upper surface of the die pad 3 via an adhesive material (silicon chip mounting step). FIG. 16 is an enlarged plan view showing a state in which a silicon chip is mounted over the lead frame shown in FIG. 14.

In this step, first, the silicon chip 7 is prepared. It is formed by singulation from a silicon wafer (semiconductor wafer). One silicon wafer can provide a plurality of silicon chips 7. Incidentally, for the method of singulation, a dicing technology commonly used for the manufacturing step of a semiconductor chip can be used.

Incidentally, as the adhesive material for bonding the silicon chip 7, a paste-like thermosetting resin can be used. However, a double sided adhesive tape called DAF (Die Attach Film) can also be used. When a DAF is used, at the stage of a wafer prior to singulation, the DAF is previously bonded to the back surface. This is cut together with the silicon chip 7 for singulation. Whereas, when a paste-like thermosetting resin is used, the paste-like adhesive material is previously coated prior to arranging the silicon chip 7 over the die pad 3. Incidentally, from the viewpoint of the material cost of the adhesive material, the paste-like adhesive material is preferable in terms of being available at a low cost.

Then, the silicon chip 7 is arranged in such a manner as to entirely cover the upper surface of the die pad 3 with the back surface opposing the upper surface of the die pad 3. Herein, as described above, from the viewpoint of improving the adhesion with the sealing body 2 (see FIGS. 6 and 7), the exposing area of the die pad 3 is preferably minimized. Similarly, when the suspending leads 4 also include Cu which is the same as with the die pad 3, the exposing area of the suspending leads 4 is also preferably made small.

Therefore, in this step, the silicon chip 7 is also bonded on the second suspending leads 4c and the first suspending leads 4b arranged around the die pad 3. This can reduce the exposing area of the die pad 3 and the suspending leads 4. After bonding of the silicon chip 7, if required, the adhesive material is heated and cured to fix the silicon chip 7 over the die pad 3. Thus, the silicon chip mounting step is completed.

Figure 17:
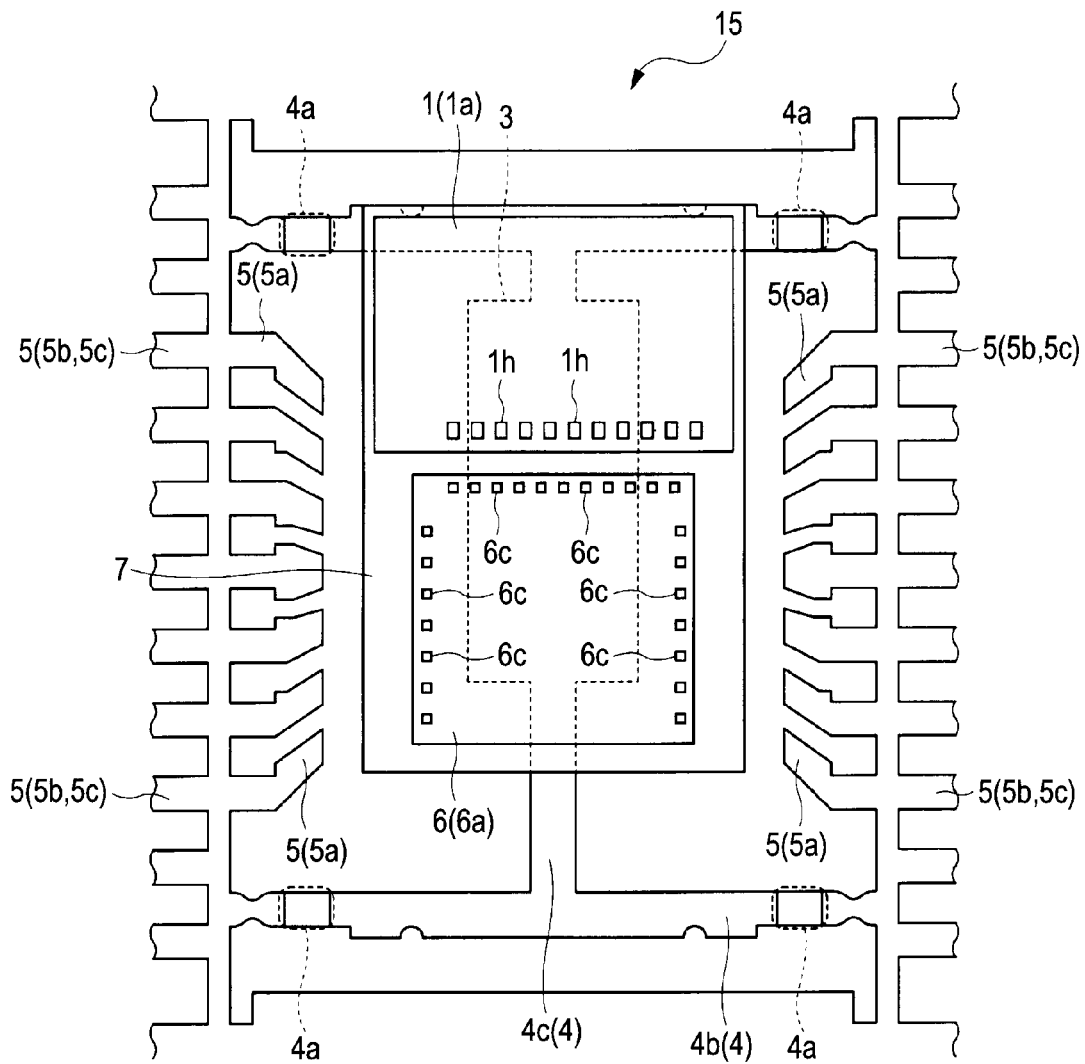
FIG. 17 is an enlarged plan view showing a state in which a controller chip is mounted on the lead frame shown in FIG. 16.

Then, as shown in FIG. 17, the sensor chip 1 and the controller chip 6 are prepared, and are respectively mounted over the upper surface of the silicon chip 7 via an adhesive material (die bonding step). FIG. 17 is an enlarged plan view showing a state in which a controller chip is mounted over the lead frame shown in FIG. 16.

In this step, first, the controller chips 6 are prepared. the controller chips 6 are formed in groups of a plurality of the chips in each wafer (semiconductor wafer). In respective ones of a plurality of chip formation regions included by the wafer, various circuits included in the controller chips 6, a plurality of the pads 6c, and the like are formed. Then, a cutting jig such as a dicing blade is allowed to run along the dicing line, resulting in singulation into individual controller chips 6.

Whereas, the sensor chip 1 is prepared. The sensor chip 1 is obtained in the following manner. For example, in the wafer state, a three-layered structure is formed in which the first lid member 1m and the second lid member 1n are bonded to the main body part 1k shown in FIGS. 3 and 4. This is singulated into individual segments.

The main body part 1k is formed into the shape described by reference to FIGS. 1 to 4 by a microprocessing technique called MEMS, such as photolithography or photoetching. Further, in the main body part 1k, other than the detection circuit DC and the exciting circuit EC described by reference to FIG. 9, an interface circuit for performing input/output of signals with the outside of the sensor chip 1 is also formed.

Further, for the first lid member 1m and the second lid member 1n, glass plate materials serving as base materials respectively having a plurality of lid member formation regions are prepared. In each lid member formation region, the cavity 1r shown in FIGS. 3 and 4 are formed. Further, in the first lid member 1m, a pad 1h is formed.

Then, the main body part 1k, the first lid member 1m, and the second lid member 1n are aligned, and then, bonded, resulting in a collective body of the sensor chips 1 in the form of a three-layered wafer. Then, a through hole reaching the main surface 1ka of the main body part 1k from the main surface 1a of the first lid member 1m is formed, thereby to form a via 1p.

Then, the collective body of the sensor chips 1 in the form of a three-layered wafer is cut on a chip formation region basis, and is singulated into chips. In this singulation step, as with the singulation step of the controller chip 6, there can be used a method in which a cutting jig such as a dicing blade is allowed to run along the dicing line. Completion of the singulation step results in the sensor chip 1 shown in FIGS. 1 to 4.

Then, the sensor chip 1 and the controller chip 6 are successively pressed against and mounted over the silicon chip 7 shown in FIG. 17 via an adhesive material.

In this step, for example, by the use of a mounting jig called collet, the sensor chip 1 or the controller chip 6 is arranged over the silicon chip 7 with the back surface 1b (back surface 6b) of the sensor chip 1 (controller chip 6) opposing the upper surface of the silicon chip 7. The area of the upper surface of the silicon chip 7 is larger than the total area of the back surface 1b of the sensor chip 1 and the back surface 6b of the controller chip 6. Accordingly, the back surfaces 1b and 6b are entirely covered with the silicon chip 7. Then, the back surface 1b (back surface 6b) of the sensor chip 1 (controller chip 6) is pressed against the silicon chip 7, and the sensor chip 1 (controller chip 6) is bonded thereto. Then, if required, the adhesive material bonding the sensor chip 1 (controller chip 6) is heated and cured, so that the sensor chip 1 (controller chip 6) is fixed over the silicon chip 7.

The sequence of mounting in this step is preferably as follows: the controller chip 6 is mounted, and then, the sensor chip 1 is mounted. As described above, the sensor chip 1 is thicker than the controller chip 6. For this reason, the controller chip 6 with a small thickness is mounted first. This can prevent the following: the mounting jig for use in mounting collides against the sensor chip 1, so that the sensor chip 1 is broken.

Incidentally, as the adhesive material for bonding the sensor chip 1 and the controller chip 6 over the silicon chip 7, as with the foregoing silicon chip mounting step, a paste-like adhesive material or a DAF can be used.

Figure 18:
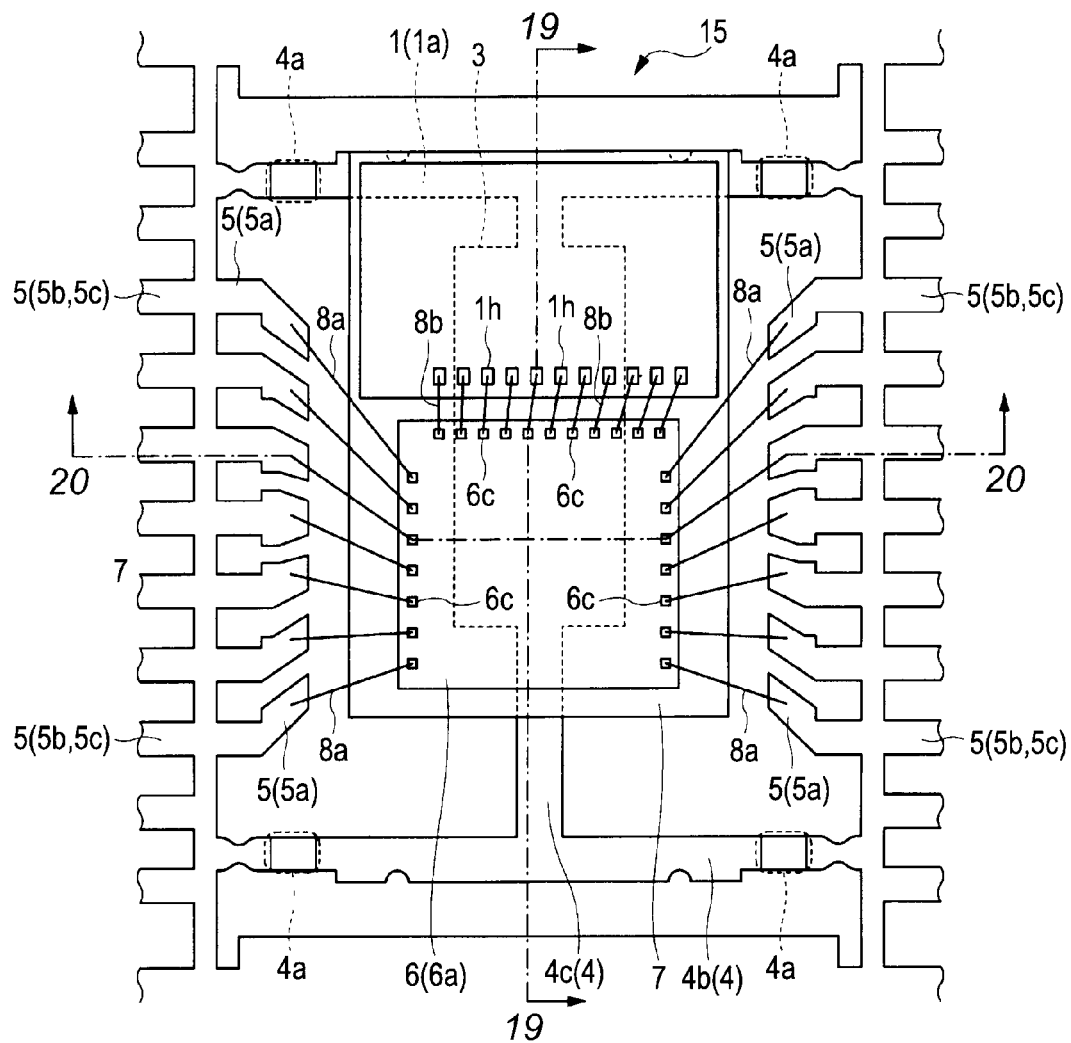
FIG. 18 is an enlarged plan view showing a state in which pads are electrically coupled via wires or the pads and leads are electrically coupled via wires shown in FIG. 17.
Figure 19:
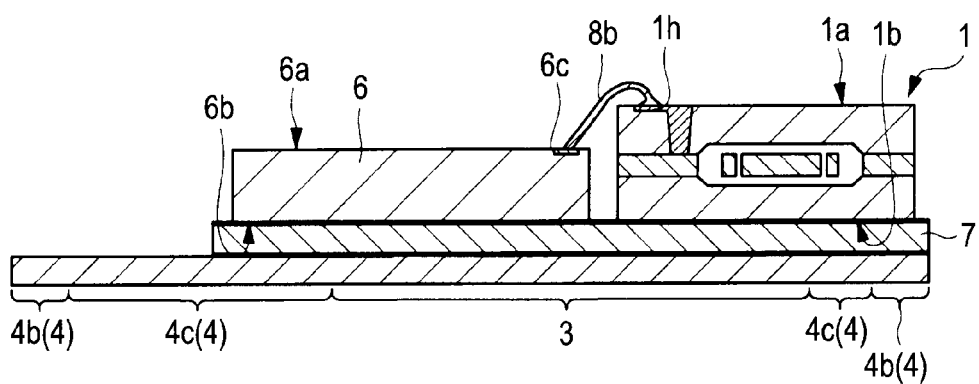
FIG. 19 is an enlarged cross sectional view along line C-C shown in FIG. 18.
Figure 20:
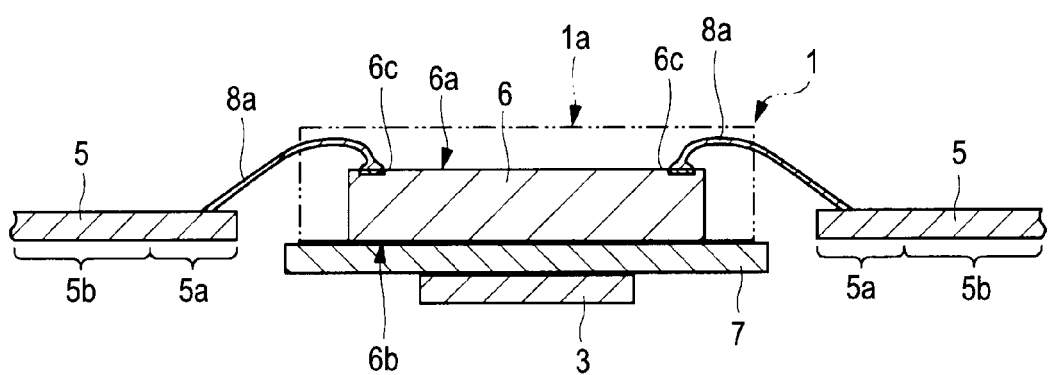
FIG. 20 is an enlarged cross sectional view along line D-D shown in FIG. 18.

Then, as shown in FIGS. 18 to 20, a plurality of pads 6c of the controller chip 6, a plurality of pads 1h of the sensor chip 1, and a plurality of the leads 5 are electrically coupled to each other via the wires 8 (8a and 8b) (wire bonding step). FIG. 18 is an enlarged plan view showing a state in which pads are electrically coupled via wires or the pads and leads are electrically coupled via wires shown in FIG. 17; FIG. 19 is an enlarged cross sectional view along line C-C shown in FIG. 18; and FIG. 20 is an enlarged cross sectional view along line D-D shown in FIG. 18.

In this embodiment, the bonding method of the wires 8 is accomplished by using ultrasonic waves and thermocompression in combination. The sequence of wire bonding is as follows: for example, first, each pad 1 of the sensor chip 1 and each pad 6c of the controller chip 6 are coupled, and then, the pad 6c of the controller chip 6 and the lead 5 are coupled.

Further, for coupling between the pads 1h and 6c, bonding is preferably accomplished with a so-called positive bonding method in which to each pad 1h of the sensor chip 1, first, one end of each wire 8b is coupled, and then, to each pad 6c of the controller chip 6, the other end is coupled. In wire bonding using a capillary, for the first side (the side on which the wire 8b is first bonded), the load necessary for bonding can be made smaller. This can reduce the load to be applied to the sensor chip 1. Further, in coupling between the pads 6c and the inner leads 5a shown in FIG. 20, the pads 6c are set as the first side.

Further, as shown in FIGS. 19 and 20, over the pads 1h and 6c which are the first sides, ball parts each formed by allowing one end of the wire 8 protruding from the tip end of a capillary (not shown) to discharge are bonded under the load of the capillary. The formation of the ball part at one end of the wire 8 can improve the bonding strength between the pads 1h and 6c which are the first side and the wire 8.

Whereas, from the viewpoint of suppress the loss of the wire loop shape of the wire 8a, the length of the wire 8a is preferably set short. For this reason, in this embodiment, the height of the top of the wire loop is lower than the height of the main surface 1a of the sensor chip 1.

Figure 21:
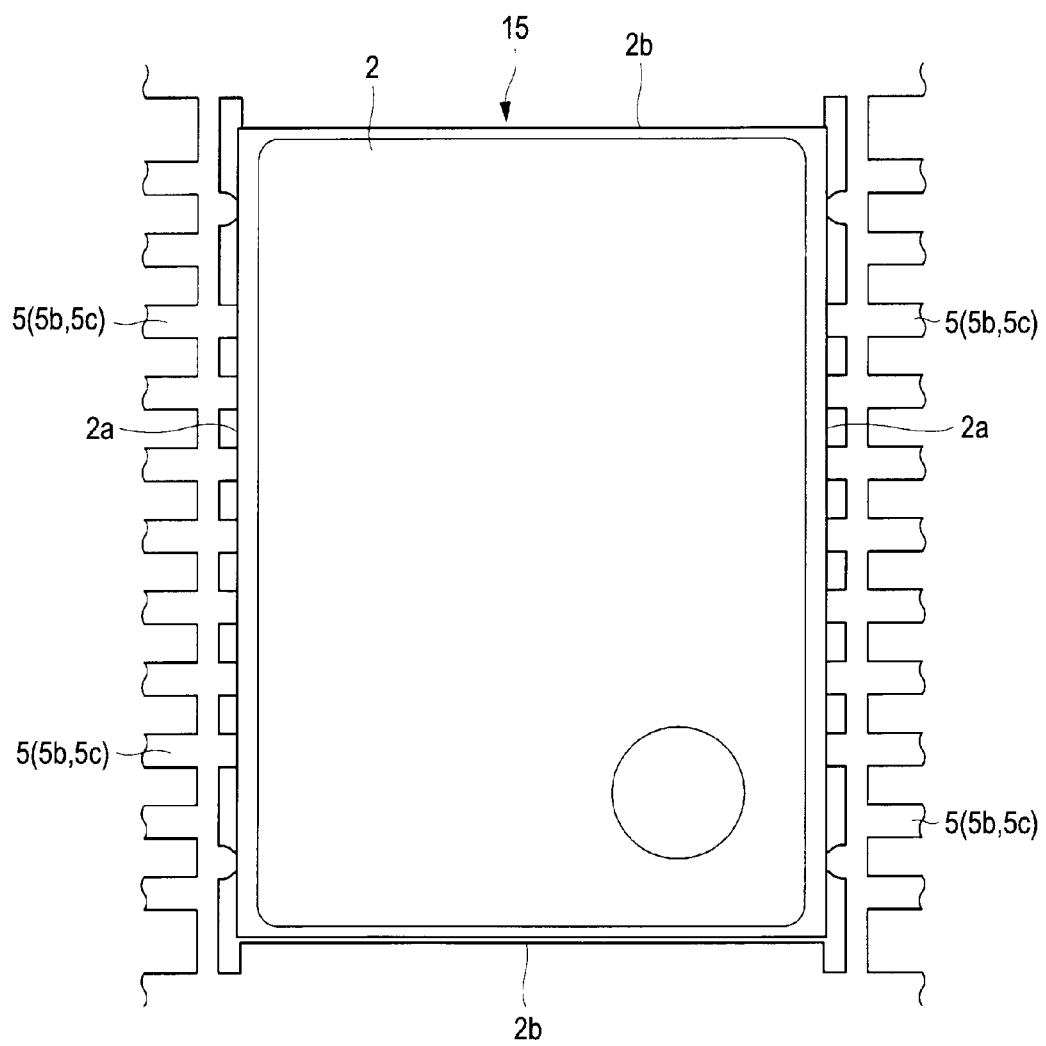
FIG. 21 is an enlarged plan view showing a state in which the sensor chip, the controller chip, the silicon chip, and a plurality of the wires shown in FIG. 18 are sealed with a resin to form a sealing body.

Then, as shown in FIG. 21, the sensor chip 1, the controller chip 6, the die pad 3, the silicon chip 7, and a plurality of the wires 8 are sealed with a resin, thereby to form a sealing body 2 (sealing step). FIG. 21 is an enlarged cross sectional view showing a state in which the sensor chip, the controller chip, the silicon chip, and a plurality of the wires shown in FIG. 18 are sealed with a resin, thereby to form a sealing body.

In this embodiment, sealing is carried out by means of a die including a plurality of cavities respectively corresponding to a plurality of the product formation regions 15a in one step. With such a so-called mold array package molding process (batch transfer molding process), a plurality of the sealing bodies 2 are formed in one step. In a singulation step described later, the resulting collective body is divided into respective SOP's 10 shown in FIGS. 5 to 8. With such a manufacturing process, a large number of the product formation regions 15a arranged in a matrix can be sealed by one sealing step. Therefore, this manufacturing step is preferable from the viewpoints of the improvement of the production efficiency and the reduction of the manufacturing cost.

Figure 22:
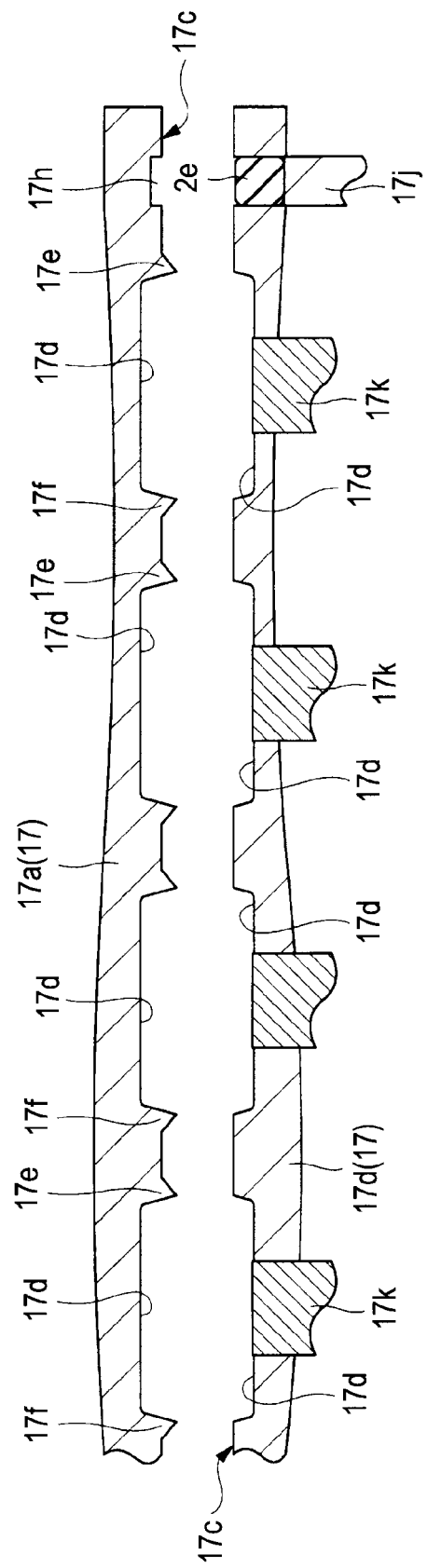
FIG. 22 is an enlarged cross sectional view showing a cross section in the direction of the short sides of the molding die for use in the formation of the sealing body of the semiconductor device which is one embodiment of the present invention.
Figure 23:
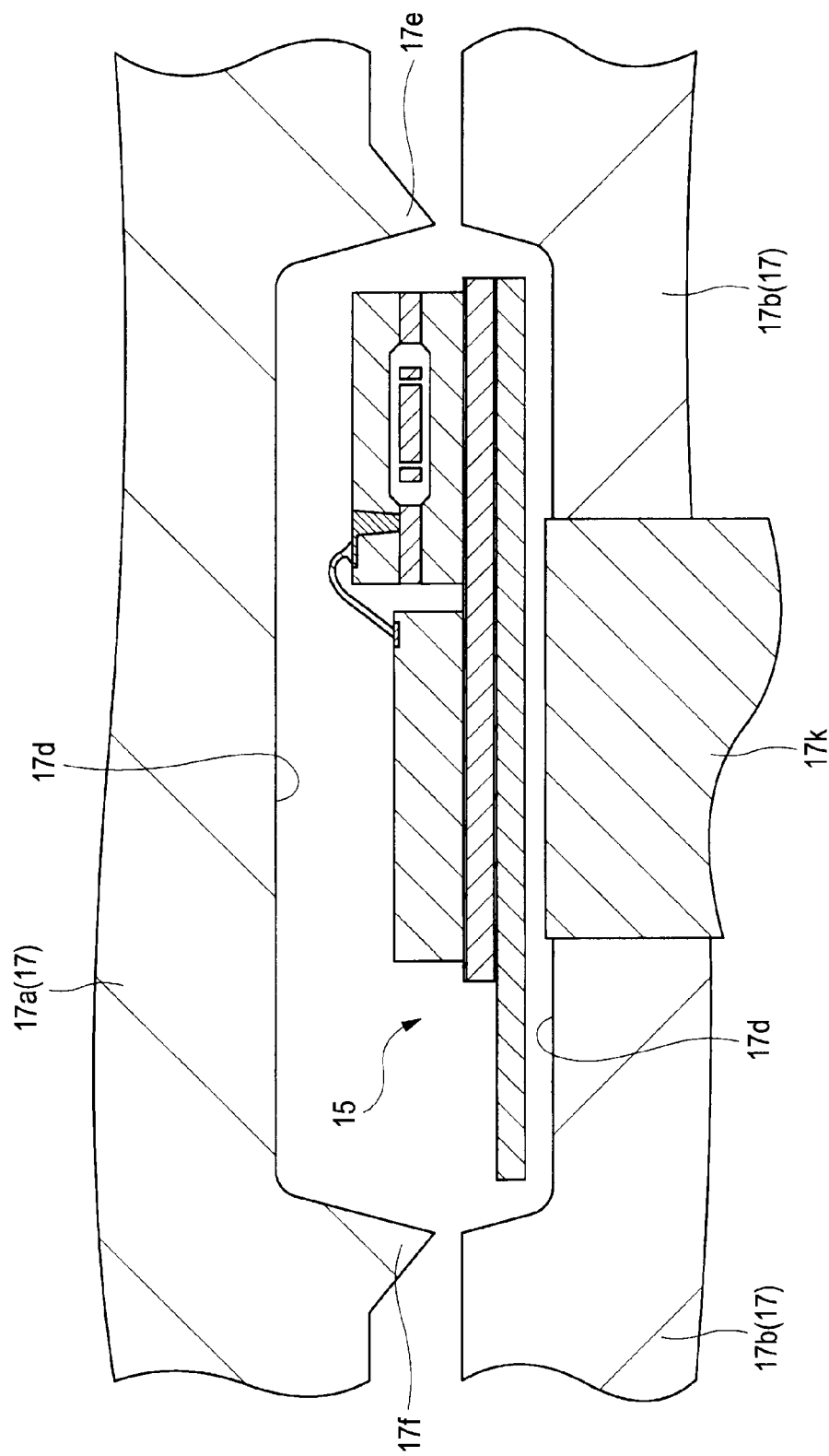
FIG. 23 is an enlarged cross sectional view showing a state in which the lead frame shown in FIG. 19 is arranged in the molding die shown in FIG. 22.

In this step, first, as shown in FIG. 22, a molding die 17 having an upper die 17a and a lower die 17b opposing the upper die 17a is prepared. In the molding die 17, the lead frame 15 after wire bonding is arranged. FIG. 22 is an enlarged cross sectional view showing a cross section in the direction of the short side of the molding die for use in the formation of the sealing body of the semiconductor device of this embodiment. FIG. 23 is an enlarged cross sectional view showing a state in which the lead frame shown in FIG. 19 is arranged in the molding die shown in FIG. 22. Incidentally, For ease of viewing, FIG. 23 shows the region corresponding to one product formation region shown in FIG. 13 on an enlarged scale.

The upper die 17a has an upper die surface 17c, a cavity 17d formed in the upper die surface 17c, a gate part 17e formed in the upper die 17a in such a manner as to communicate with the cavity 17d, and for supplying a resin, and an air vent part 17c at a position opposing the gate part 17e via the cavity 17d, and formed in the upper die 17a. Further, the side surface of the cavity 17d is inclined toward the inside from the outside, which improves the releasability when the lead frame 15 including the sealing bodies 2 formed therein is taken out from the molding die 17.

On the other hand, the lower die 17b has a lower die surface 17g opposing the upper die surface 17c of the upper die 17a. Also in the lower die surface 17g, a cavity 17d is formed. The product formation region 15a (see FIG. 13) of the lead frame 15 is arranged in the space formed by matching the upper and lower cavities 17d. Incidentally, the molding die 17 interpose and supports the frame body 15b of the lead frame 15 (see FIG. 13) and the like between the upper die 17a and the lower die 17b. As a result, a space is formed over the sensor chip 1 and under the die pad 3. Into the space, a sealing resin flows, thereby to seal them. Whereas, in each cavity 17d of the lower die surface 17g, there is arranged an ejector pin 17k which is a press jig for taking out the lead frame 15 after formation of the sealing body from the molding die 17.

Further, the molding die 17 has a pot part 17h formed by matching the upper die 17a and the lower die 17b. The pot part 17h communicates with the cavity 17d via the resin flow path such as the gate part 17e or the air vent part 17d. Further, in the pot part 17h, there is arranged a plunger 17j for charging a resin to form the sealing body 2.

Then, the upper die 17a and the lower die 17b are made close to each other to perform matching thereof. At this step, the upper die 17a and the lower die 17b interpose the lead frame 15. As a result, the lead frame 15 is fixed in the molding die 17.

Then, a sealing resin 2e shown in FIG. 22 is supplied into between the upper die 17a and the lower die 17b (in the molding die), thereby to form the sealing body 2. In this step, the sealing resin 2e is supplied into the cavity 17d, and is thermoset, resulting in the sealing body 2. The sealing resin 2e, formed in a tablet as shown in FIG. 22, is preheated, thereby to be reduced in viscosity, and is charged in the pot part 7h. Further, by preheating the molding die 17, the resin 2e is further reduced in viscosity in the pot part 17h. Then, the resin 2e is pressed out by the plunger 17j, and is supplied (injected) into the cavity 17d via the gate part 17e. The injected resin 2e is charged while successively filling the gap in the cavity 17.

Figure 24:
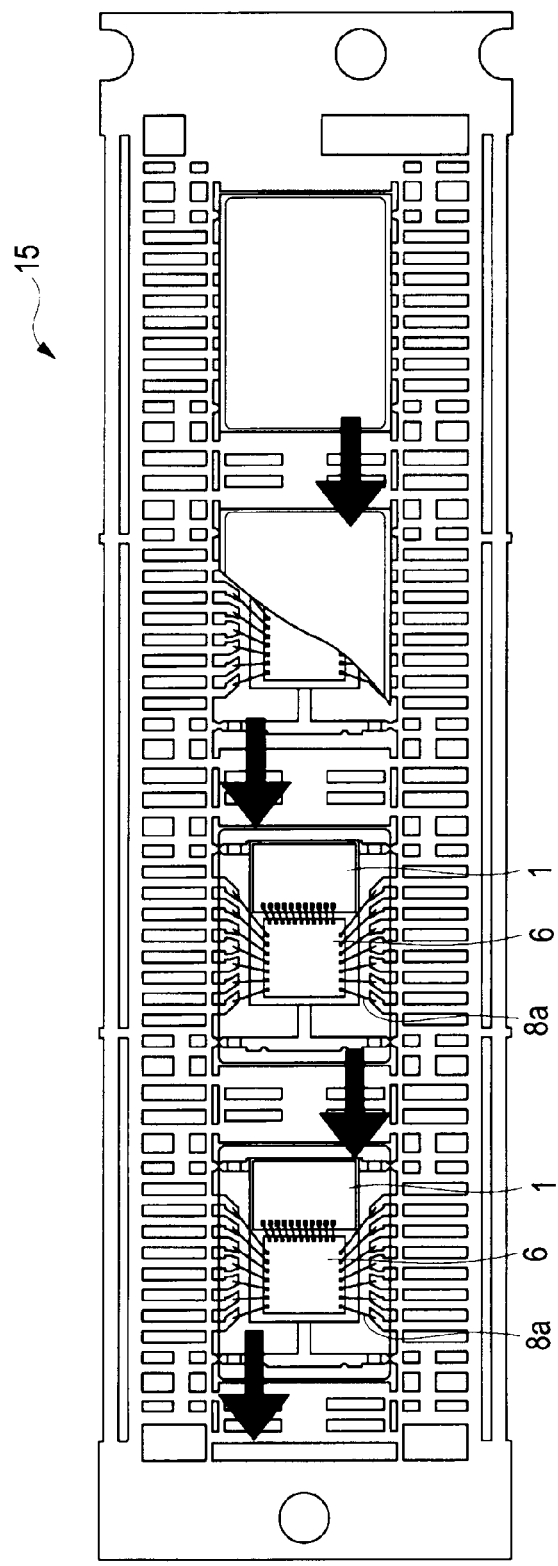
FIG. 24 is an enlarged plan view showing the direction of flow of a resin to be injected in a sealing step.
Figure 25:
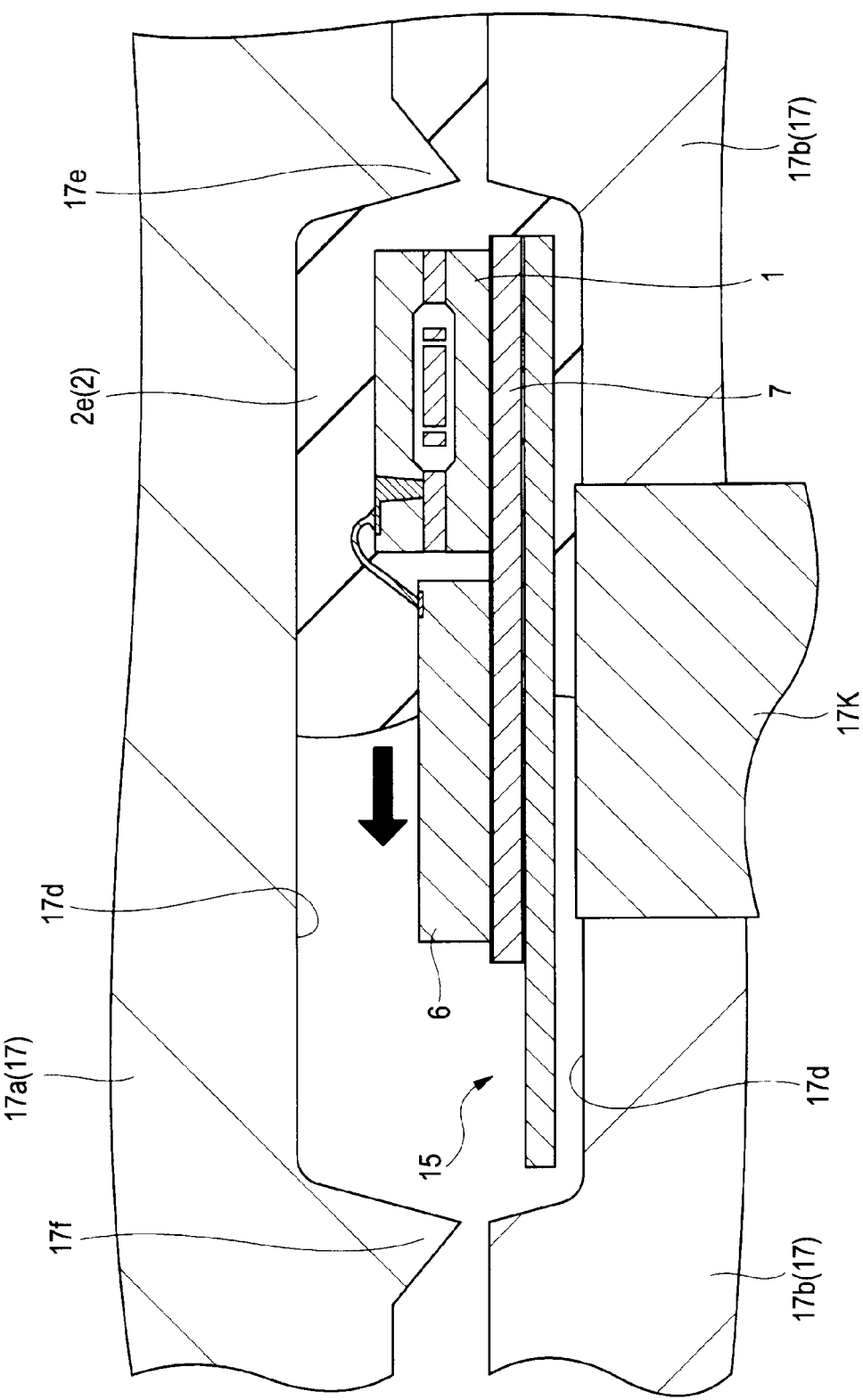
FIG. 25 is an enlarged cross sectional view showing a state in which the resin is being injected in the molding die shown in FIG. 23.

Herein, in this embodiment, in the molding die 17, the lead frame 15 is arranged so that the sensor chip 1 is closer to the gate part 17e than the controller chip 6. For this reason, through the flow path for the resin 2e when the sealing resin 2e is injected, the resin 2e flows in the direction from the sensor chip 1 to the controller chip 6 as shown in FIGS. 24 and 25. FIG. 24 is an enlarged plan view showing the direction of flow of a resin to be injected in the sealing step of this embodiment. FIG. 25 is an enlarged cross sectional view showing a state in which the resin is being injected in the molding die shown in FIG. 23.

In this embodiment, the controller chip 6 is arranged at the middle of the product formation region 15a (see FIG. 13). Therefore, as shown in FIG. 18, the wire 8e arranged closest to the sensor chip 1 out of the wires 8a for respectively coupling the pads 6c and the leads 5 is at a very short distance from the sensor chip 1. Further, the sensor chip 1 is thicker than the controller chip 6. Therefore, in the sealing step, the wire loop shape of the wire 8a is deformed toward the sensor chip 1 under the pressure when the sealing resin 2e is injected, there may occur a short circuit between the wire 8a and the sensor chip 1.

Particularly, the sensor chip 1 is thicker than the controller chip 6. Therefore, when the sealing resin 2e is made to flow toward the sensor chip 1 from the controller chip 6 side, the injection resistance increases in the vicinity of the sensor chip 1. Therefore, the injection pressure increases accordingly. This results in an increase in risk of deformation of the wire loop shape of the wire 8a toward the sensor chip 1 side.

Thus, in this embodiment, the resin 2e to be injected is made to flow from the sensor chip 1 side toward the controller chip 6. As a result, even when the shape of the wire 8a is deformed under the pressure during injection of the resin 2e, the wire 8a is deformed in the opposite direction from the sensor chip 1. This can prevent a short circuit with the sensor chip 1.

Further, as shown in FIG. 25, over the silicon chip 7, the sensor chip 1 with a large thickness is mounted. Accordingly, the total thickness of the silicon chip 7 and the sensor chip 1 is very large. Therefore, unless the height of the die pad 3 is sufficiently reduced, the resin 2e to be injected preferentially flows to the lower surface side of the die pad 3 with a less injection resistance. Thus, the part overlying the sensor chip 1 may not be able to be sealed with reliability. However, in accordance with this embodiment, as shown in FIG. 18, the offset parts 4a are formed in the first suspending leads 4b extending in the direction of array of a plurality of the leads 5. As a result, the difference in height between the die pad 3 and the leads 5 can be made large. In other words, the height of the die pad 3 can be lowered sufficiently. Therefore, the balance of the space in the cavity 17d can be adjusted. Therefore, as shown in FIG. 25, the resin 2e can also be made to flow to above the sensor chip 1 with reliability. As a result, it is possible to seal the sensor chip 1 with reliability.

Incidentally, the molding die 17 has the air vent 17f opposed to the gate part 17e. Therefore, even when air (bubbles) are caught in the supplied resin 2e, the air (bubbles) do not remain in the cavity 17d, and go to the outside via the air vent part 17f. Therefore, no void problem will occur in the resulting sealing body 2.

When the resin 2e is held in a heated state via the molding die 17 being filled with the resin 2e, the resin 2e becomes cured. Thus, the sealing body 2 is formed.

Then, the upper die 17a and the lower die 17b are opened, and the sealing body 2 is pressed up from the lower surface side by the ejector pin 17k. As a result, the lead frame 15 is taken out from the molding die 17. This results in the lead frame 15 including a plurality of the sealing bodies 2 formed therein.

Then, to a plurality of the leads 5 exposed from the sealing body 2, the external plating layer (metal layer) 5 is formed (external plating layer formation step). In this step, for example, the lead frame 15 including the sealing body 2 shown in FIG. 21 is charged into a plating tank not shown. With the lead frame 15 immersed in a plating solution, electroplating is performed. Thus, a plating layer is grown over the surfaces of the leads 5, thereby to form the external plating layer 5*c*.

Then, cutting is performed between each of a plurality of the suspending leads and a plurality of the leads 5 and the frame body 15*b* (singulation step). In this step, for example, the lead frame 15 is interposed by a die for press working including a punch and a die. Thus, unnecessary portions of the lead frame 15 are cut. Further, at this step, a plurality of the leads 5 (outer leads 5*b*) exposed from the sealing body 2 are subjected to bending working, and are formed in a gull-wing shape as shown in FIG. 7. By this step, a plurality of the SOP's 10 (see FIGS. 5 to 8) are obtained.

Finally, the outward appearances of the singulated SOP's 10 are inspected. Thus, it is checked that release of the external plating layer 5*c*, and a gap or a crack between the sealing body 2 and the leads 5 do not occur. Thus, manufacturing of the semiconductor device is completed.

Up to this point, the invention done by the present inventors was described specifically by way of the embodiments, which should not be construed as limiting the present invention. It is naturally understood that various changes may be made within the scope not departing from the gist.

Figure 26:
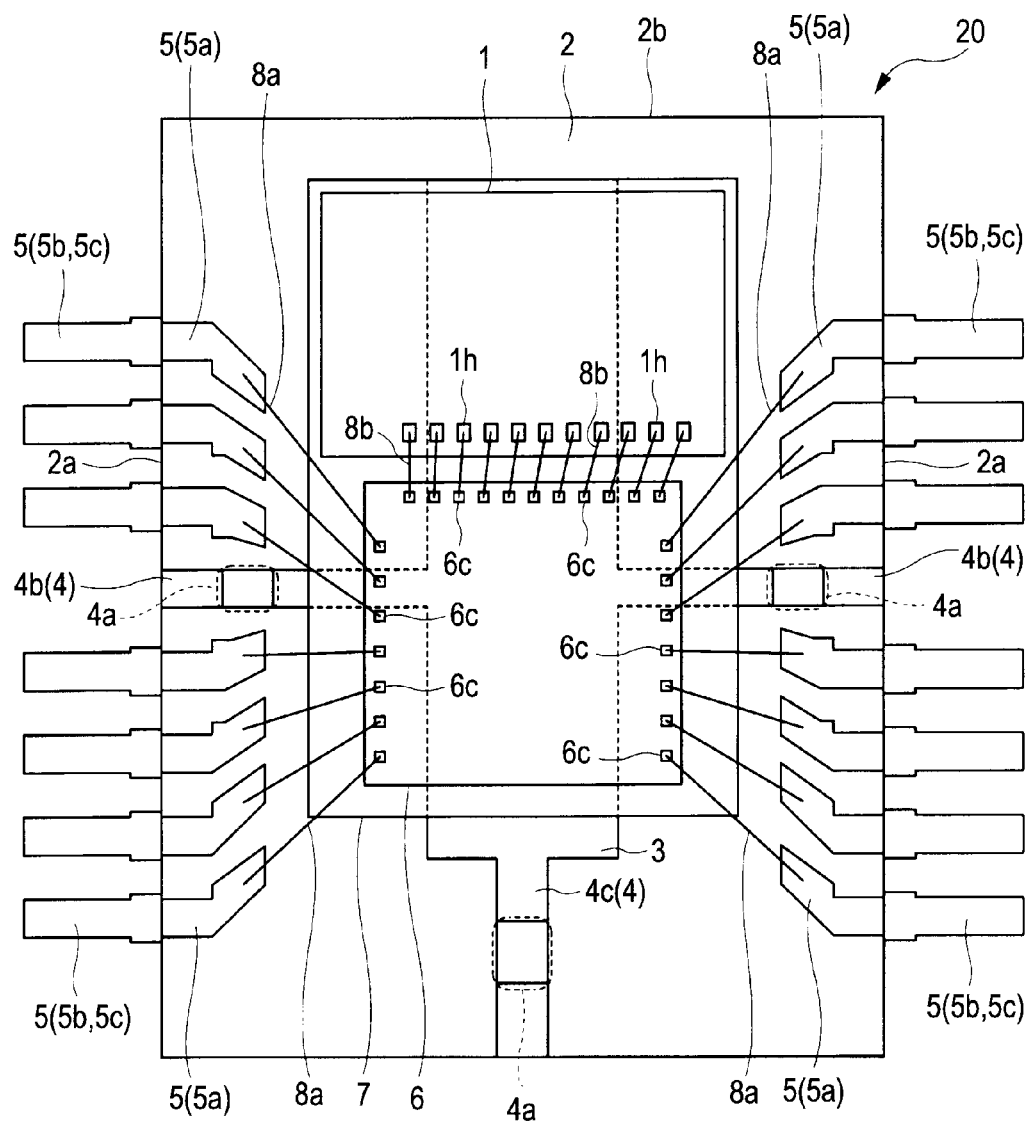
FIG. 26 is a perspective plan view showing the inside structure of a SOP which is a modified example of the present invention.

For example, in this embodiment, a description was given to the example in which only in the first suspending leads 4*b*, the offset parts 4*a* are formed, but in the second suspending leads 4*c*, the offset parts 4*a* are not formed. However, as with the SOP 20 which is a modified example shown in FIG. 26, the offset parts 4*a* can also be formed in both the first suspending leads 4*b* and the second suspending leads 4*c*. FIG. 26 is a perspective plan view showing the inside structure of the SOP which is the modified example of this embodiment.

The SOP 20 shown in FIG. 26 is different from the SOP 10 shown in FIGS. 5 to 8 in terms of the arrangement of the offset parts 4*a*, the corresponding arrangement of the suspending leads 4 and the leads 5, and the size of the die pad 3.

First, in the SOP 20, the die pad 3 is supported by two first suspending leads 4*b* extending from the die pad 3 toward first sides 2*a* along which a plurality of leads are arranged, and one second suspending lead 4*c* extending toward the second side 2*b* crossing with the first side 2*a*. In other words, the SOP 20 is supported by the three suspending leads 4. Also in the SOP 20, as with the SOP 10, the controller chip 6 is arranged at the middle thereof. Therefore, on the opposite side of the side on which the sensor chip 1 is arranged with respect to the controller chip 6, the planar space of the SOP 20 has some clearance. Therefore, when the offset part 4*a* is formed in the second suspending lead 4*c* extending toward the second side located more distant from the sensor chip 1 than from the controller chip 6 (the second side closer to the controller chip 6) out of the two second sides 2*b*, the amount of bending working to be performed (offset amount) can be set large. In this case, the first suspending leads 4*b* extending toward the two first sides 2*a* are formed one for each first side 2*a*. Therefore, as compared with the SOP 10 shown in FIG. 8, the space for leading out the first suspending lead 4*b* can be set smaller. Accordingly, in the SOP 20, the length of the first side 2*a* can be set short, which can prevent an increase in package dimensions in the direction of the long side.

However, in the SOP 20, the die pad 3 is supported by the three suspending leads 4. For this reason, the support strength of the die pad 3 is required to be improved. Thus, by making the area of the die pad 3 of the SOP 20 than the area of the die pad 3 of the SOP 10, respective lengths of a plurality of the suspending leads 4 must be shortened, or the width of the second suspending lead 4*c* must be increased. However, as already described, an increase in area of the die pad 3 results in the reduction of the adhesion with the sealing body 2. Therefore, from the viewpoint of reducing the area of the die pad 3, the offset parts 4*a* are preferably formed only in the first leads 4*b* as with the SOP 10.

Further, in the embodiment, a description was given to the following case: respective portions of a plurality of the first suspending leads 4*b* are subjected to bending working, so that the offset parts 4*a* are formed in the respective portions of a plurality of the first suspending leads 4*b*. However, each of a plurality of the first suspending leads 4*b* may be subjected to bending working at a plurality of sites thereof (or a plurality of sites in the second suspending lead 4*c*). The reason for this is as follow. As described above, the sensor chip 1 and the controller chip 6 are mounted over the silicon chip 7. Further, the thickness of the sensor chip 1 is larger than the thickness of the controller chip 6. Therefore, in order to ensure a large difference between the height of the die pad 3 and the height of the lead 5 by one offset part 4*a*, the amount of bending working to be performed (offset amount, bending amount) is also required to be increased. Thus, when the distance between the die pad 3 and the side of the sealing body 2 is large, bending working is performed on a plurality of sites in each of a plurality of the suspending leads 4. This can reduce the offset amount per one site, which can reduce the bending stress caused at each offset part.

Further, in the embodiment, a description was given to the following case: as the shape of the die pad 3, there is adopted the shape such that a part of the back surface of the silicon chip 7 is in contact with the sealing body 2. However, so long as the outer shape dimensions of the SOP 10 can be increased, and the release amount caused at the interface between the die pad 3 and the sealing body 2 can also be reduced, there may be used the die pad 3 having a larger area than the total area of the controller chip 6 and the sensor chip 1.

The present invention is available in a resin sealing type semiconductor device in which a sensor chip and a controller chip are resin-sealed with a sealing body.

What is claimed is:

1. A semiconductor device comprising:
   a sealing body having a planar shape comprised of a quadrangle including a pair of first sides, and a pair of second sides crossing with the first sides;
   a die pad;
   a plurality of suspending leads formed integrally with the die pad and extending from the die pad toward the first side of the sealing body;
   a plurality of leads arranged around the die pad, and arranged along the first sides of the sealing body;
   a first semiconductor chip having a first main surface, a plurality of first electrode pads formed on the first main surface, and a first back surface opposed to the first main surface, and mounted over the die pad;
   a second semiconductor chip having a second main surface, a plurality of second electrode pads formed on the second main surface, and a second back surface opposed to the second main surface, and mounted over the die pad;

a plurality of first wires for electrically coupling the leads and the first electrode pads of the first semiconductor chip, respectively; and a plurality of second wires for electrically coupling the first electrode pads of the first semiconductor chip and the second electrode pads of the second semiconductor chip, respectively, wherein the die pad, the suspending leads, the leads, the first semiconductor chip, the second semiconductor chip, the first wires, and the second wires are covered with the sealing body; and wherein each of the suspending leads has an offset part.

2. The semiconductor device according to claim 1, wherein a thickness of the second semiconductor chip is larger than that of the first semiconductor chip.

3. The semiconductor device according to claim 2, wherein the second semiconductor chip is a sensor chip having a hollow part formed between the second main surface and the second back surface, and a movable part arranged inside of the hollow part.

4. The semiconductor device according to claim 3, wherein the area of an upper surface of the die pad is smaller than the total area of the first back surface of the first semiconductor chip and the second back surface of the second semiconductor chip.

5. The semiconductor device according to claim 3, wherein a silicon chip having an upper surface larger in area than the second back surface of the second semiconductor chip is arranged between the second semiconductor chip and the die pad; and wherein the second back surface of the second semiconductor chip is bonded to the silicon chip such that the second back surface of the semiconductor chip is entirely covered with the silicon chip.

6. The semiconductor device according to claim 5, wherein in the leads, a metal layer is formed over the surface of each region exposed from the sealing body; and wherein the leads, the suspending leads, and the die pad are comprised of Cu (copper).

7. The semiconductor device according to claim 6, wherein the first back surface of the first semiconductor chip is also bonded to an upper surface of the silicon chip.

8. The semiconductor device according to claim 7, wherein the silicon chip is bonded to the die pad, and the suspending leads; and wherein the upper surface of the die pad is covered with the lower surface of the silicon chip.

9. The semiconductor device according to claim 1, wherein the offset part has a tilt portion, and bent portions located on both sides of the tilt portion; and wherein the tilt angle of the tilt portion with respect to an upper surface of the die pad is 45 degrees or less.

10. The semiconductor device according to claim 1, wherein the first semiconductor chip is arranged at the middle of the semiconductor device in plan view.

11. The semiconductor device according to claim 10, wherein the number of the leads arranged lateral to the second semiconductor chip is smaller than that of the leads arranged lateral to the first semiconductor chip.

12. The semiconductor device according to claim 1, wherein the die pad is formed integrally with a plurality of first suspending leads extending along a first direction which is directed toward the first side of the sealing body, and a second suspending lead extending along a second direction crossing with the first direction; and wherein the offset part is formed in the first suspending leads, and is not formed in the second suspending lead.

* * * * *